(12) United States Patent
Darbee

(10) Patent No.: US 6,496,135 B1
(45) Date of Patent: Dec. 17, 2002

(54) REMOTE CONTROL WITH LED CAPABILITIES

(75) Inventor: Paul V. Darbee, Santa Ana, CA (US)

(73) Assignee: Universal Electronics Inc., Cypress, CA (US)

(*) Notice: Subject to any disclaimer, the term of this patent is extended or adjusted under 35 U.S.C. 154(b) by 0 days.

(21) Appl. No.: 09/871,872

(22) Filed: Jun. 1, 2001

Related U.S. Application Data

(63) Continuation of application No. 09/791,354, filed on Feb. 23, 2001, which is a continuation of application No. 09/408,729, filed on Sep. 29, 1999, now Pat. No. 6,195,033, which is a continuation-in-part of application No. 07/990,854, filed on Dec. 11, 1992, now Pat. No. 6,014,092, which is a continuation-in-part of application No. 09/913,523, filed on Jul. 14, 1992, now abandoned, which is a continuation-in-part of application No. 07/586,957, filed on Sep. 24, 1990, now abandoned, which is a continuation-in-part of application No. 07/127,999, filed on Dec. 2, 1987, now Pat. No. 4,959,810, which is a continuation-in-part of application No. 07/109,336, filed on Oct. 14, 1987, now abandoned.

(51) Int. Cl.$^7$ ............................................. G08C 19/12
(52) U.S. Cl. .................. 341/173; 340/825.56; 359/142; 359/148
(58) Field of Search ................................ 341/173, 176, 341/175; 340/825.69, 825.56, 825.72; 359/148, 142

(56) References Cited

U.S. PATENT DOCUMENTS

| | | | |
|---|---|---|---|
| 4,038,533 A | 7/1977 | Dummermuth et al. | |
| 4,412,218 A * | 10/1983 | Niitsu | 340/14.1 |
| 4,623,887 A | 11/1986 | Welles, II | 340/825.57 |
| 4,626,848 A | 12/1986 | Ehlers | 340/825.69 |
| 4,703,359 A | 10/1987 | Rumbolt et al. | |
| 4,746,919 A * | 5/1988 | Reitmeier | 340/10.2 |
| 4,774,511 A | 9/1988 | Rumbolt et al. | |
| 4,825,200 A * | 4/1989 | Evans et al. | 340/825.56 |
| 4,866,434 A * | 9/1989 | Keenan | 340/7.4 |
| 4,959,810 A * | 9/1990 | Darbee et al. | 340/825.57 |
| 5,515,052 A * | 5/1996 | Darbee | 340/825.57 |
| 5,614,906 A * | 3/1997 | Hayes et al. | 340/825.37 |
| 5,910,784 A * | 6/1999 | Lai | 340/825.69 |
| 5,945,936 A * | 8/1999 | Issa | 340/426 |
| 6,107,951 A * | 8/2000 | Katayama et al. | 340/825.57 |
| 6,127,961 A * | 10/2000 | Stacy et al. | 340/825.69 |
| 6,236,350 B1 * | 5/2001 | Andrews | 340/825.69 |
| 6,344,817 B1 * | 2/2002 | Verzulli | 340/825.69 |

* cited by examiner

Primary Examiner—Michael Horabik
Assistant Examiner—Albert K. Wong
(74) Attorney, Agent, or Firm—Mark R. Galis; Gary R. Jarosik

(57) ABSTRACT

A universal remote control comprising a keyboard having a plurality of pushbuttons including a macro pushbutton and a library of codes and data for use in transmitting operating commands to a plurality of different home appliances of different manufacturers. Instructions within the remote control are used to match the universal remote control to a plurality of different home appliances of different manufacturers such that selected codes and data from the library are used to transmit operating commands to the matched home appliances in response to activation of selected pushbuttons of the keyboard. The instructions are also used to assign to the macro pushbutton a subset of the selected codes and data from the library whereafter activation of the macro pushbutton causes the universal remote control to use the subset of selected codes and data from the library to transmit operating commands to one or more of the matched home appliances.

14 Claims, 17 Drawing Sheets

TO IDENTIFY WHAT DEVICE REMOTE IS SET FOR-BLINK CODE

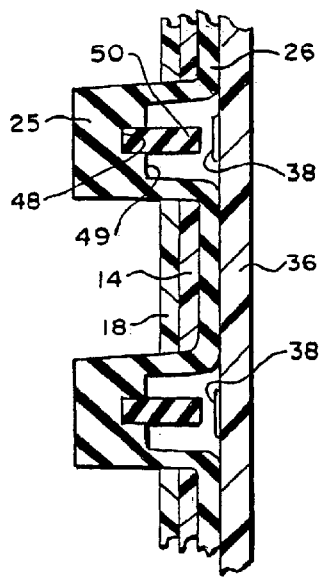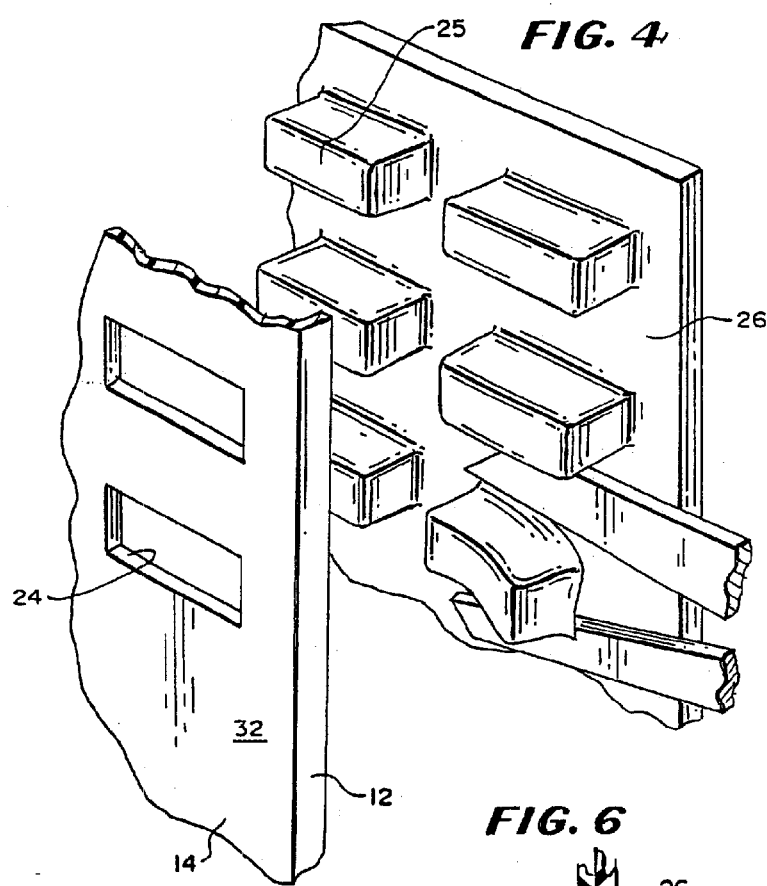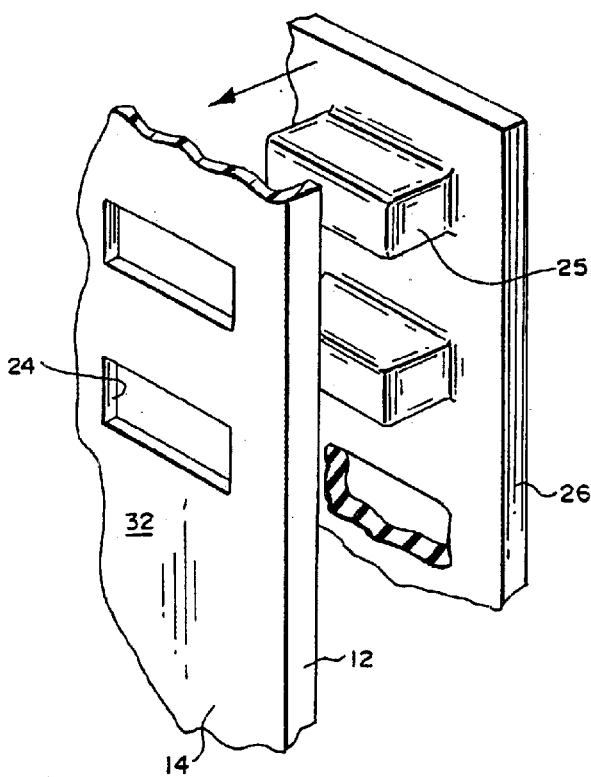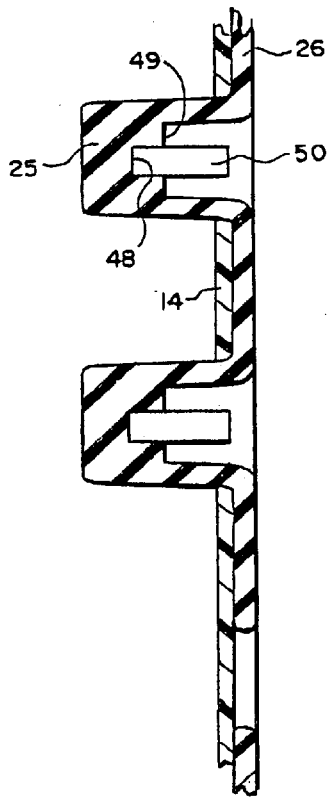

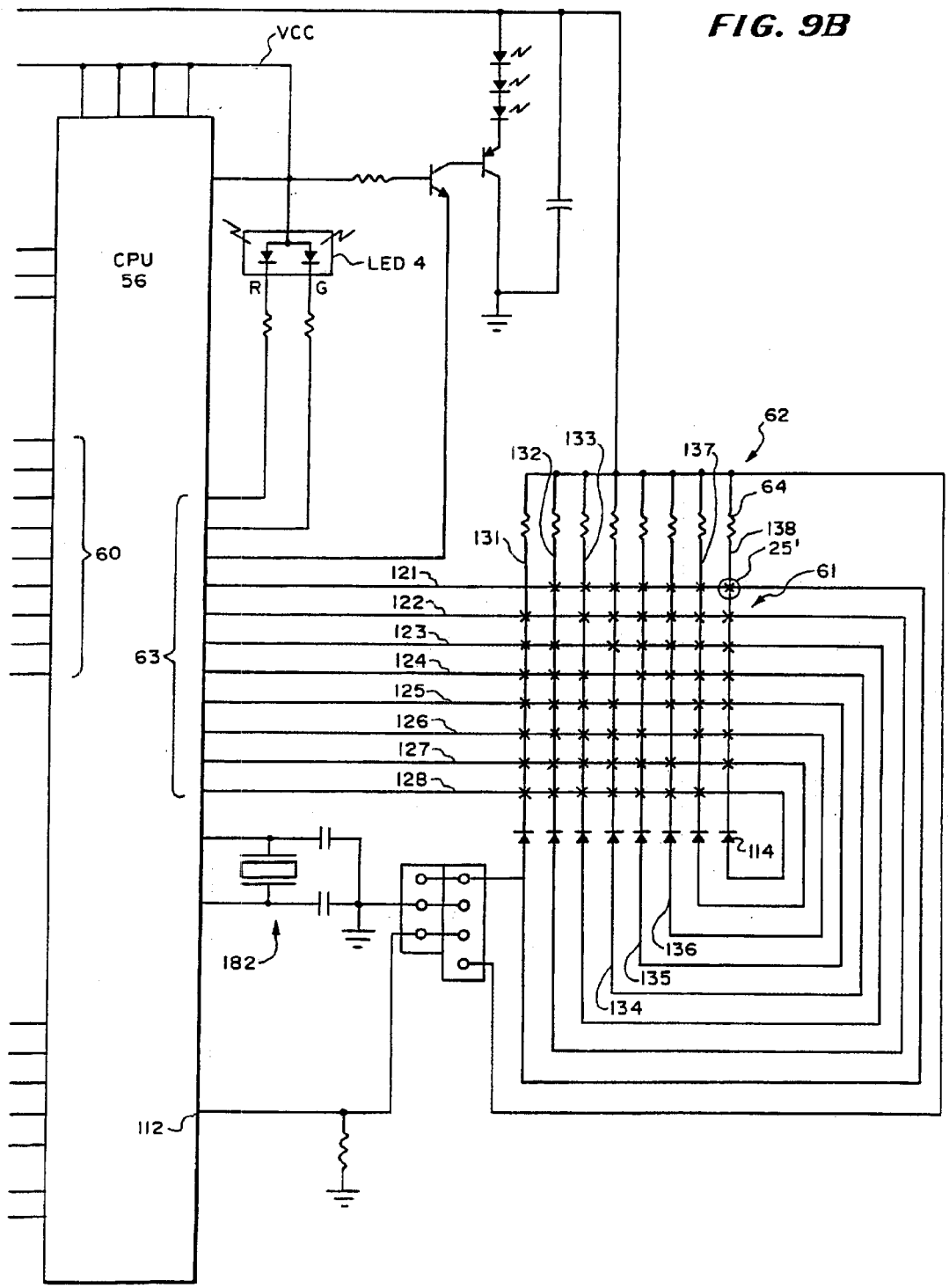

FIG. 11
MODULATION SCHEMES
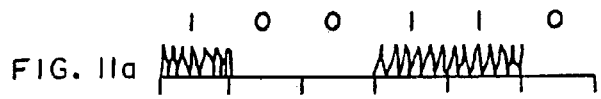
FIG. 11a — FIXED BIT TIME, FULL WIDTH BURST
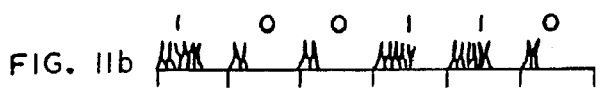
FIG. 11b — FIXED BIT TIME, BURST WIDTH MODULATED
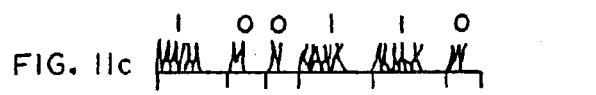
FIG. 11c — FIXED OFF TIME, BURST WIDTH MODULATED
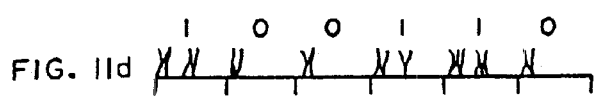
FIG. 11d — FIXED BIT TIME, SINGLE/DOUBLE BURST
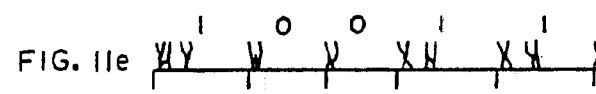
FIG. 11e — FIXED OFF TIME, SINGLE/DOUBLE BURST
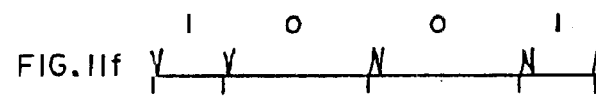
FIG. 11f — FIXED BURST TIME, OFF TIME MODULATED
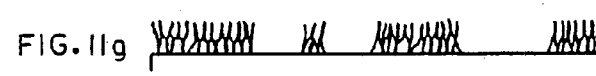
FIG. 11g — RANDOM
FIG. 11h — ONE FREQUENCY FOR EACH KEY
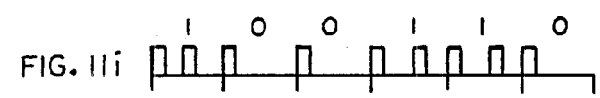
FIG. 11i — SINGLE/DOUBLE PULSE, FIXED BIT TIME

CAPTURING IR CODE

FIG. 13A
CAPTURING IR CODE
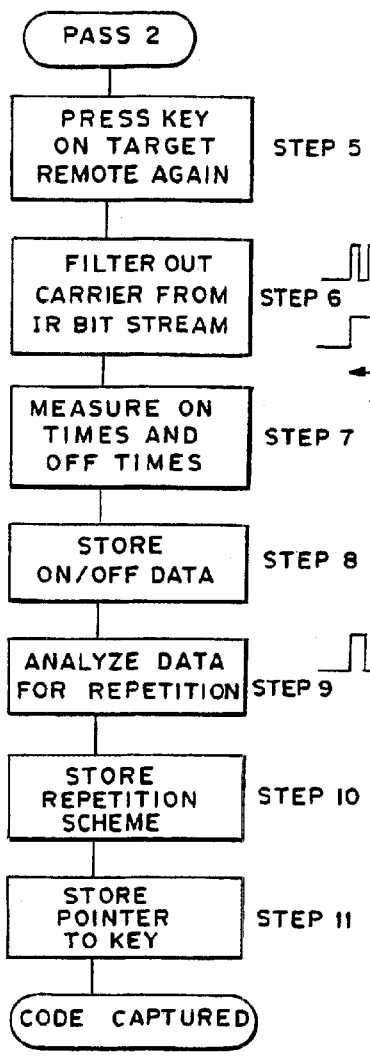
FIG. 13B
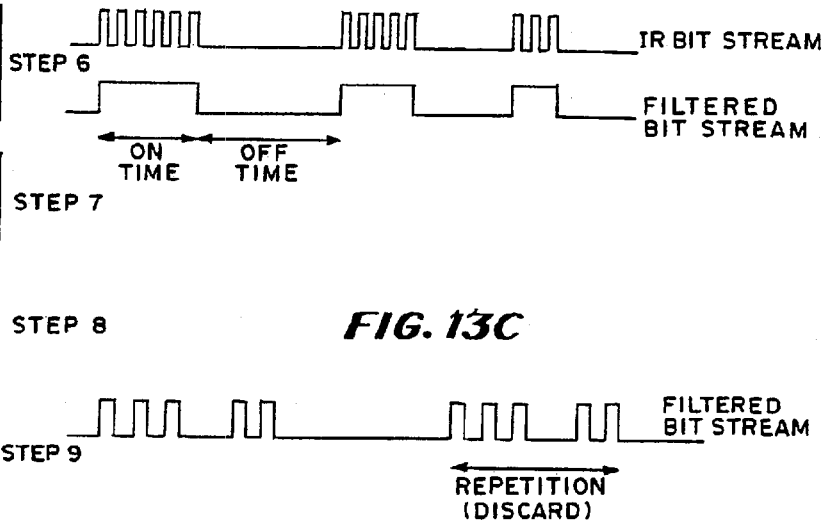
FIG. 13C

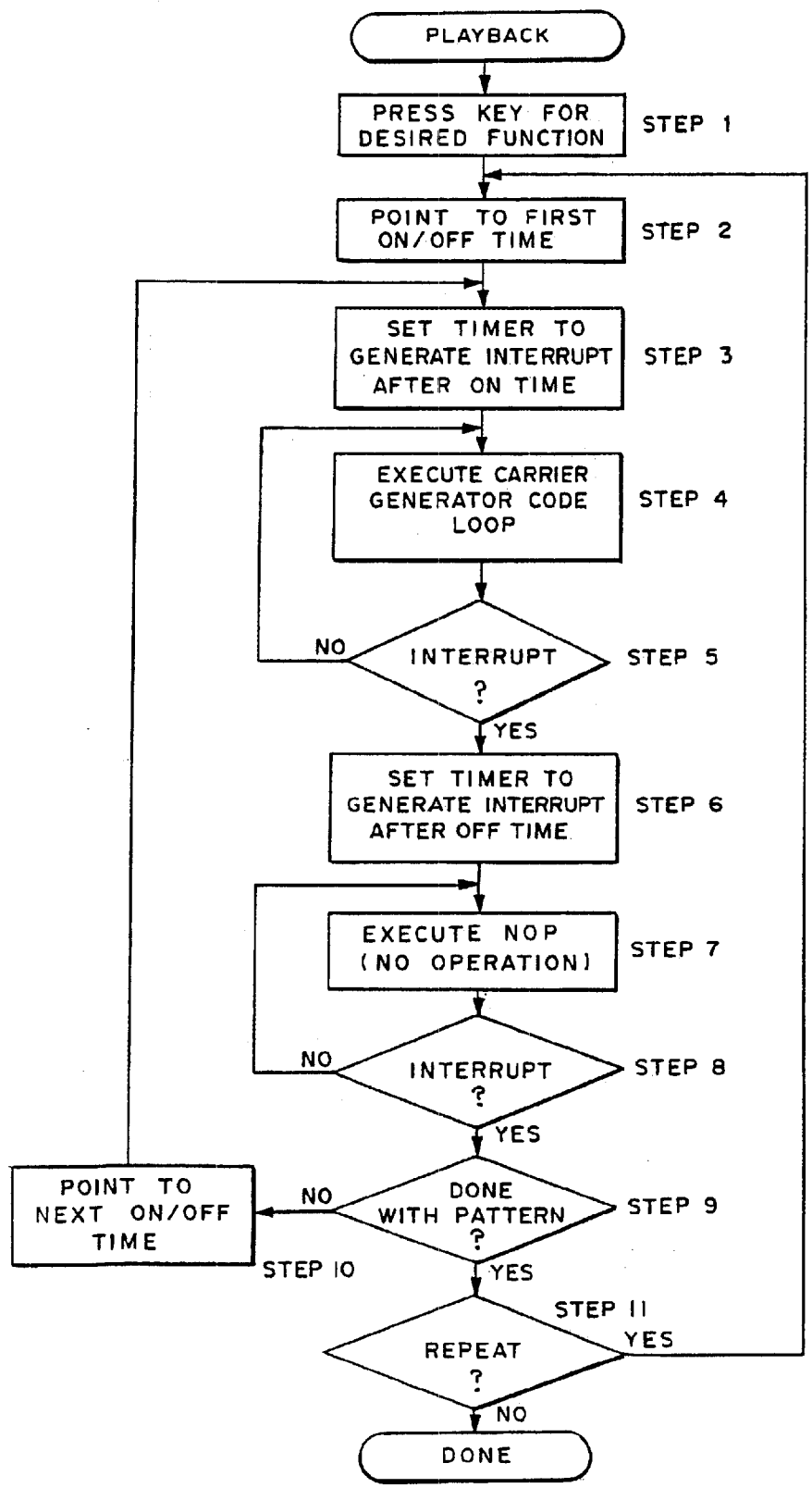
FIG. 14  GENERATING IR CODE

STEP AND SET METHOD

DIRECT ENTRY—QUICK SET

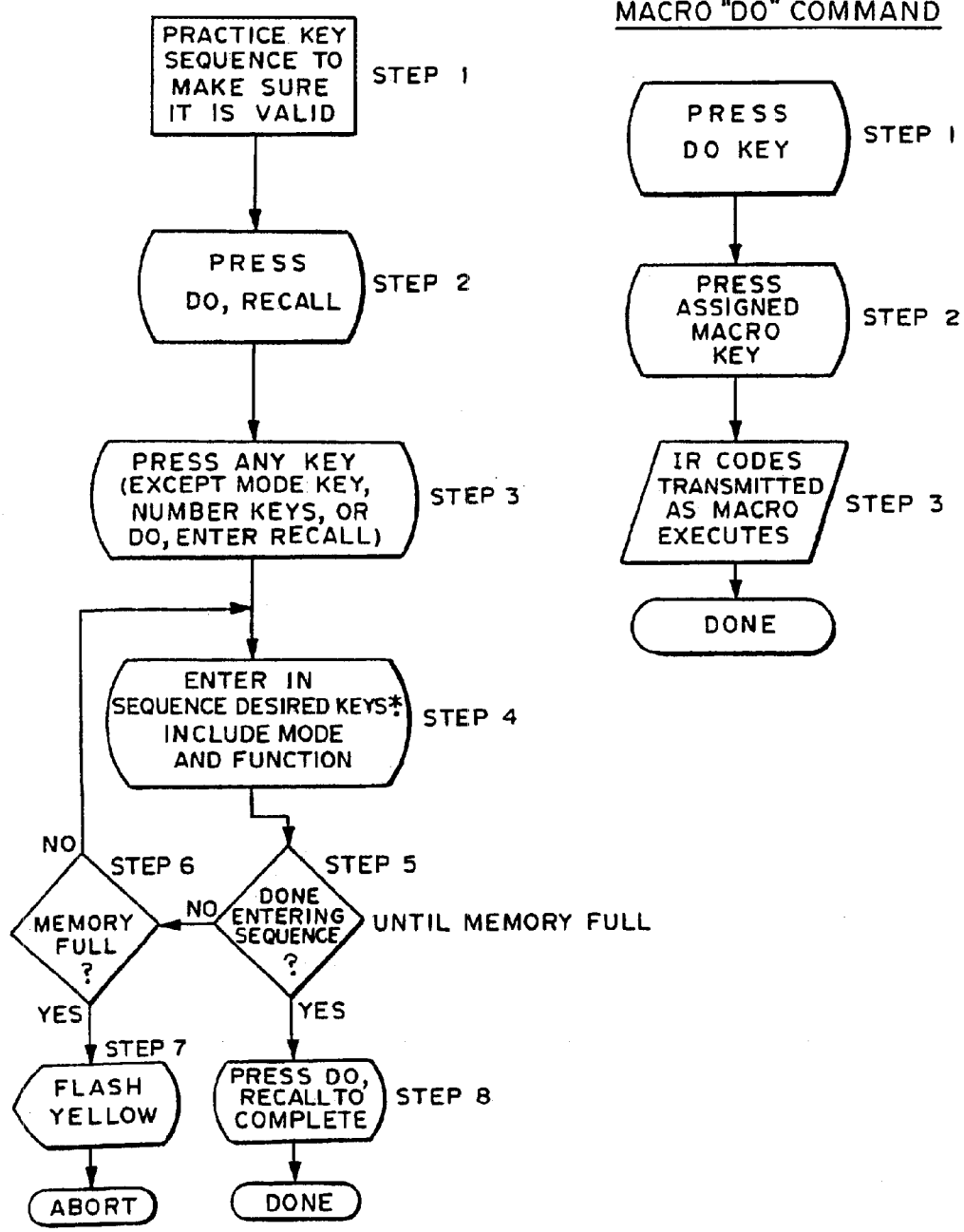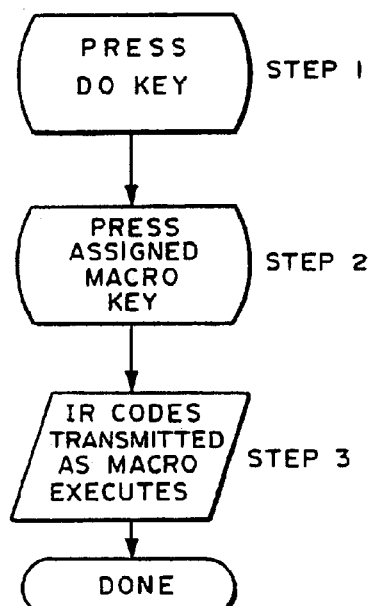
FIG. 18A
SETTING A "DO" COMMAND MACRO
FIG. 18B
EXECUTING A MACRO "DO" COMMAND
\* eq. TV, POWER, VCR 1, POWER, PLAY, TV, 3, ENTER

TO IDENTIFY WHAT DEVICE REMOTE IS SET FOR—BLINK CODE

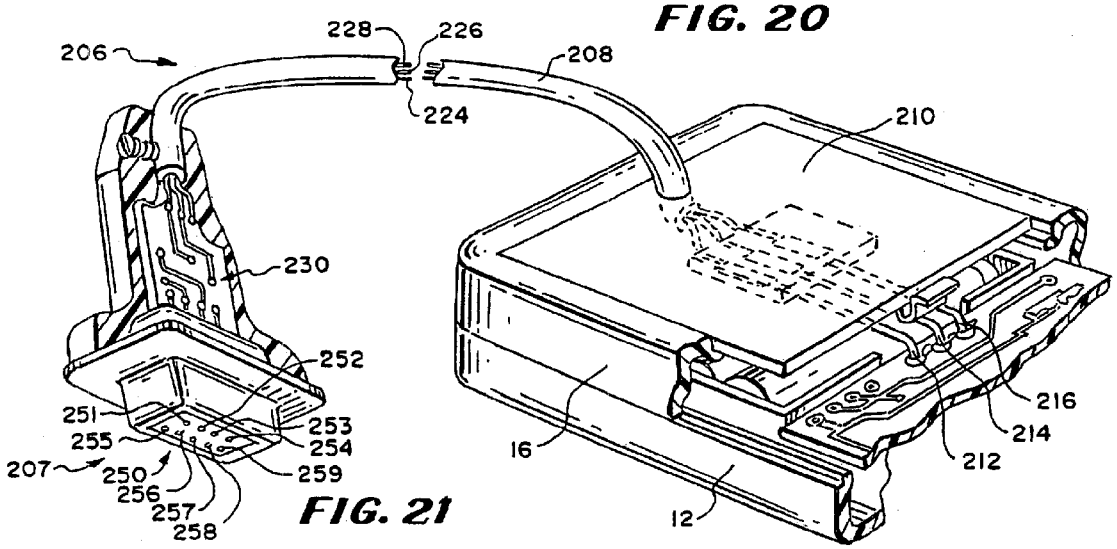
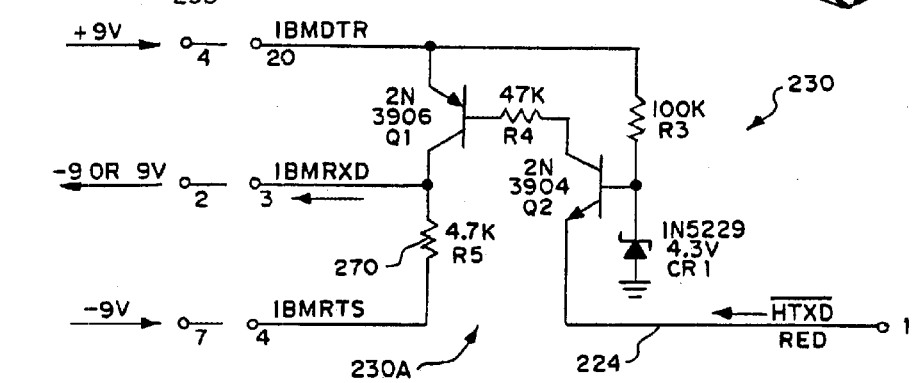
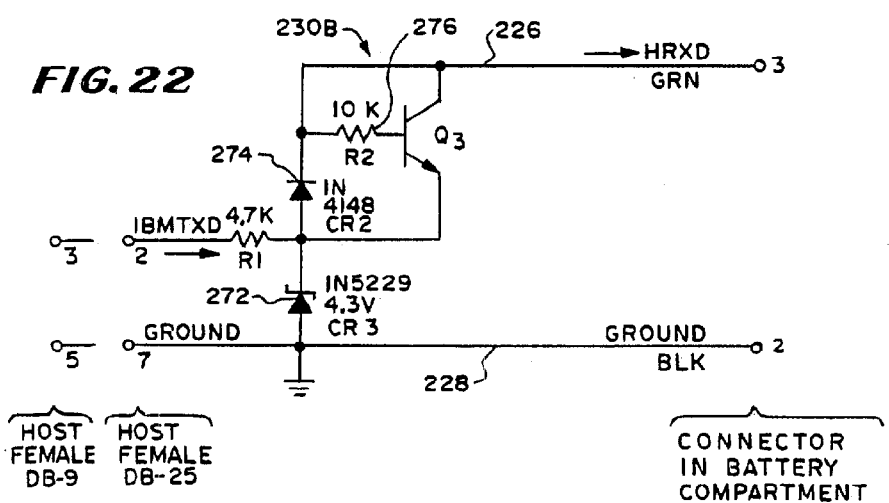

REMOTE CONTROL WITH LED CAPABILITIES

CROSS-REFERENCE TO RELATED APPLICATIONS

This patent application claims the priority date of U.S. application Ser. No. 07/109,336 filed on Oct. 14, 1987, now abandoned, as a continuation of co-pending U.S. application Ser. No. 09/791,354 filed on Feb. 23, 2001, which is a continuation of U.S. application Ser. No. 09/408,729 filed on Sep. 29, 1999, now U.S. Pat. No. 6,195,033, which is a continuation-in-part of U.S. application Ser. No. 07/990,854 filed on Dec. 11, 1992, now U.S. Pat. No. 6,014,092, which is a continuation-in-part of U.S. application Ser. No. 07/913,523 filed on Jul. 14, 1992, now abandoned, which is a continuation-in-part of U.S. application Ser. No. 07/586,957 filed on Sep. 24, 1990, now abandoned, which is a continuation-in-part of U.S. application Ser. No 07/127,999 filed on Dec. 2, 1987, now U.S. Pat. No. 4,959,810, which is a continuation-in-part of U.S. application Ser. No. 07/109,336.

This patent application contains the specification of U.S. application Ser. No 07/127,999 filed on Dec. 2, 1987, now U.S. Pat. No. 4,959,810.

BACKGROUND OF THE INVENTION

1. Field of the Invention

The present invention relates to a universal remote control device of the type which is hand held and which can be coupled via coded infrared signals with a remote control receiver built into a television or other remotely controlled electrical apparatus to turn on the apparatus, such as the television, at a distance, to adjust the volume, tone and brightness, to change channels, and to turn the television off.

Additionally, the present invention relates to a method for acquiring the infrared codes for a controlled apparatus, such as a television, generating code data related to these infrared codes for storage in a remote control device and methods for using the remote control device for finding, in a library or table of code data for generating infarared codes for operating different electrical apparatus manufactured by different manufacturers stored in a RAM of the remote control device, the code data for generating infrared coded signals for operating a particular apparatus, such as a television, and then for using the stored code data for generating the coded infrared signals for operating the controlled apparatus.

2. Description of the Prior Art

Heretofore it has been proposed to provide a reconfigurable remote control device and programmable functions for such a remote control device which will enable one to learn, store and retransmit infrared codes that are emitted from the controller for a remotely controlled apparatus, such as a television.

For example, in the Welles II U.S. Pat. No. 4,623,887 and the Ehlers U.S. Pat. No. 4,626,848, there is disclosed a reconfigurable remote control device which has the ability to learn, store and repeat remote control codes from any other infrared transmitter. Such a reconfigurable remote control transmitter device includes an infrared receiver, a microprocessor, a non-volatile random access memory, a scratch pad random access memory, and an infrared transmitter.

According to the teachings of the Ehlers patent, the infrared signals received by the remote control device are in bursts of pulses and the device counts the number of pulses in each burst as well as the time duration of each pause in a transmission between bursts.

As will be described in greater detail hereinafter, the universal remote control device of the present invention utilizes a single non-volatile RAM does not provide a separate scratch pad RAM or, more importantly, a ROM.

In learning the infrared code and transforming same to code data which is then stored in a RAM of the control device and later used to generate infrared codes, a novel method is utilized wherein no counting of pulses takes place, and only the time duration of the pulses in a burst of pulses from the leading edge of the first pulse in a burst of pulses to the trailing edge of the last pulse in the burst as well as the time duration of the pause between bursts are sensed and used to learn and later to generate the infrared codes.

Additionally, unique methods for use of the remote control device are provided so that a number of infrared operation code sequences can be generated by the remote control device for operating various types of electronic apparatus.

SUMMARY OF THE INVENTION

According to the invention there is provided a universal remote control system having input means for inputting commands, signal output means for supplying infrared signals to a controlled device, a central processing unit (CPU) coupled to the input means and to the signal output means, a single non-volatile, read-write RAM (such as a battery-backed RAM) coupled to the central processing unit and data coupling means including terminal means coupled to the CPU for enabling new code data to be supplied from outside the system to, or retrieved from the RAM through the terminal means and the CPU.

Further according to the invention, there is provided a method of loading a RAM in a ROM-less microprocessor system comprising a central processing unit, a single non-volatile, read-write RAM, input means, output means, and means for coupling said central processing unit, said RAM, said input means, and said output means together, said method including the steps of:

(a) disabling the central processing unit;

(b) connecting a separate microprocessor system to said RAM;

(c) transferring instructions and/or data to said RAM;

(d) re-enabling the central processing unit to enable the central processing unit to execute the instructions so transferred.

Still further according to the present invention, there is provided a process of learning, storing and reproducing the remote control codes of any of a diverse plurality of remote control transmitters, comprising the steps of:

(a) receiving a transmission of a train of pulses from a remote control transmitter;

(b) recording the point-in-time of an edge of each pulse in a train of said pulses;

(c) transforming the recorded point-in-time data into a list of instructions for generating a replica of said train of pulses;

(d) timing the duration of a train of said pulses;

(e) timing the period between trains of pulses;

(f) associating a function key of a universal remote control device with said time duration of said train of pulses and said list of instructions for generating a replica of said train of pulses;

(g) determining whether or not repetitions of the transmission of train of pulses is present;
(h) ignoring repetitions of the train of pulses;
(i) noting that repetitions are present; and
(j) storing for use in a universal remote control device, the information acquired in steps (c), (d),
(e), (f) and (i).

BRIEF DESCRIPTION OF THE DRAWINGS

FIG. 3 is an enlarged fragmentary sectional view through two of the push buttons of the control device shown in FIGS. 1 and 2.

FIG. 4 is a fragmentary corner view of a push button containing panel and a base panel.

FIG. 5 is a fragmentary corner view similar to FIG. 4 as the panels are brought together and shows one of the push buttons cut away from the push button containing panel.

FIG. 6 is a fragmentary sectional view of the assembly formed by bringing the push button containing panel into engagement with the base panel.

FIGS. 9A & 9B are a detailed schematic circuit diagram of the operating circuitry shown in FIG. 8.

FIGS. 11a to 11i are graphical representations of several modulation schemes which are used in infrared remote control transmitters.

FIG. 13A is a flow chart of a second part of a method for 5 capturing an IR code; FIG. 13B is a waveform of the IR bit stream and filtered bit stream; and FIG. 13C is a graph of the waveform of a filtered repetition of a filtered bit stream.

FIG. 14 is a flow chart of the method used for generating an infrared code.

FIG. 18A is a flow chart of the procedure followed in setting a "DO" command and FIG. 18B is a flow chart of the method for executing a "DO" command.

FIG. 20 is a fragmentary perspective view with portions broken away of a connector with conversion circuitry therein and a special battery case cover for the control device by which new data can be inputed into the RAM of the operating circuitry of the control device.

FIG. 21 is a schematic circuit diagram of part of the conversion circuitry in the connector shown in FIG. 20.

FIG. 22 is a schematic circuit diagram of another part of the conversion circuitry in the connector shown in FIG. 20.

DETAILED DESCRIPTION

Figure 1:
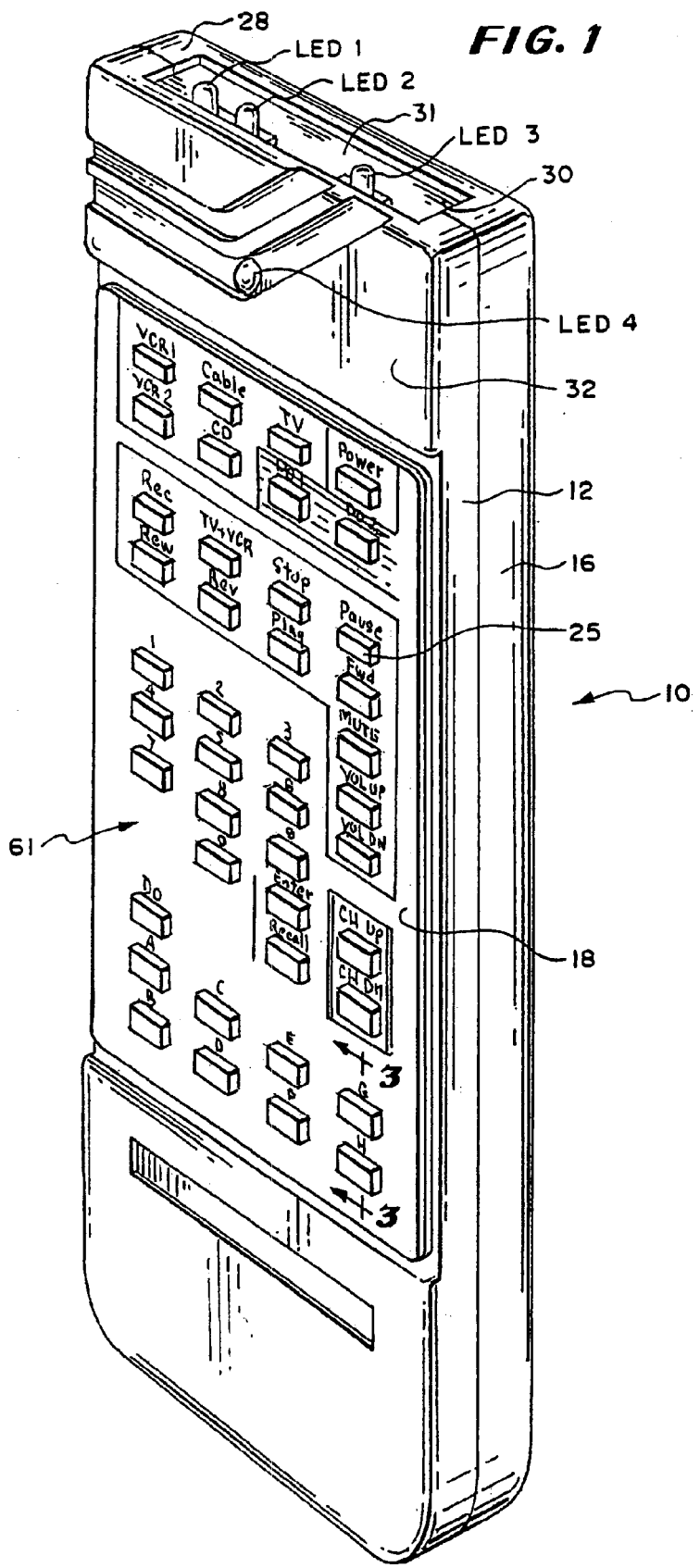
FIG. 1 is a front perspective view of the universal remote control device constructed according to the teachings of the present invention.

Referring now to FIG. 1 in greater detail, there is illustrated therein a universal remote control device 10 constructed according to the teachings of the present invention.

As shown, the device 10 includes a housing 11 including an upper housing member 12 having a base panel 14, and a lower housing member 16. An overlay face panel 18 is positioned over the base panel 14.

Figure 2:
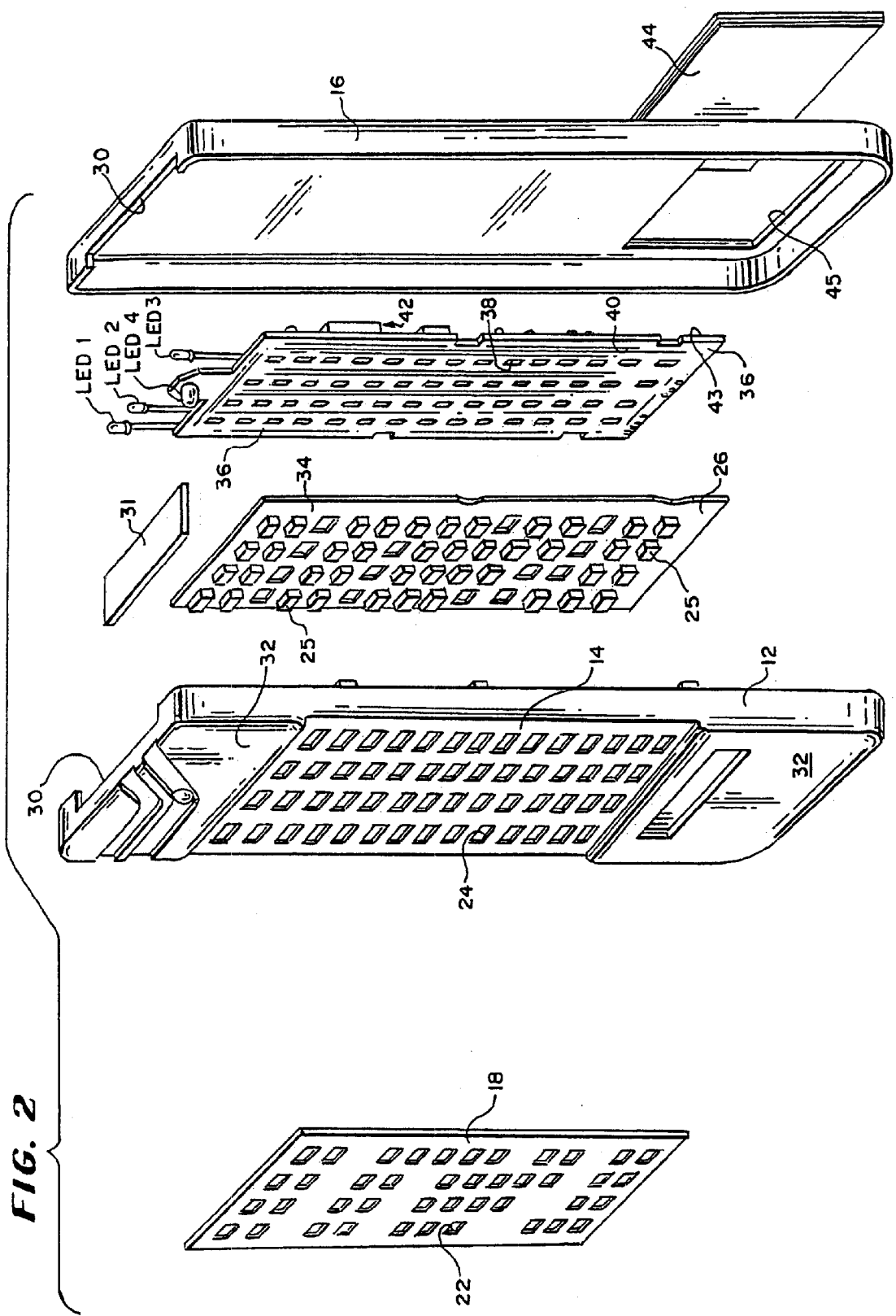
FIG. 2 is an exploded perspective view of the control device shown in FIG. 1.

The two panels 14 and 18 have openings 22 and 24 (FIG. 2) therethrough for receiving elastomeric pushbuttons 25, all of which extend from and are fixed to or integral with an elastomeric body panel 26 as shown in FIG. 2.

The pushbuttons 25 are arranged in rows and columns and are identified as follows on the overlay face panel 18:

| | | | Power |
|---|---|---|---|
| VCR 1 | Cable | TV | DO 2 |
| VCR 2 | CD | DO 1 | Pause |
| Rec | TV.VCR | Stop | Fast Fwd |
| Rew | Reverse | Play | Mute |
| 1 | 2 | 3 | Vol Up |
| 4 | 5 | 6 | Vol Dn |
| 7 | 8 | 9 | |
| | 0 | Enter | CH Up |
| | | Recall | CH Dn |
| DO | | | |
| A | C | E | G |
| B | D | F | H |

Figure 15:
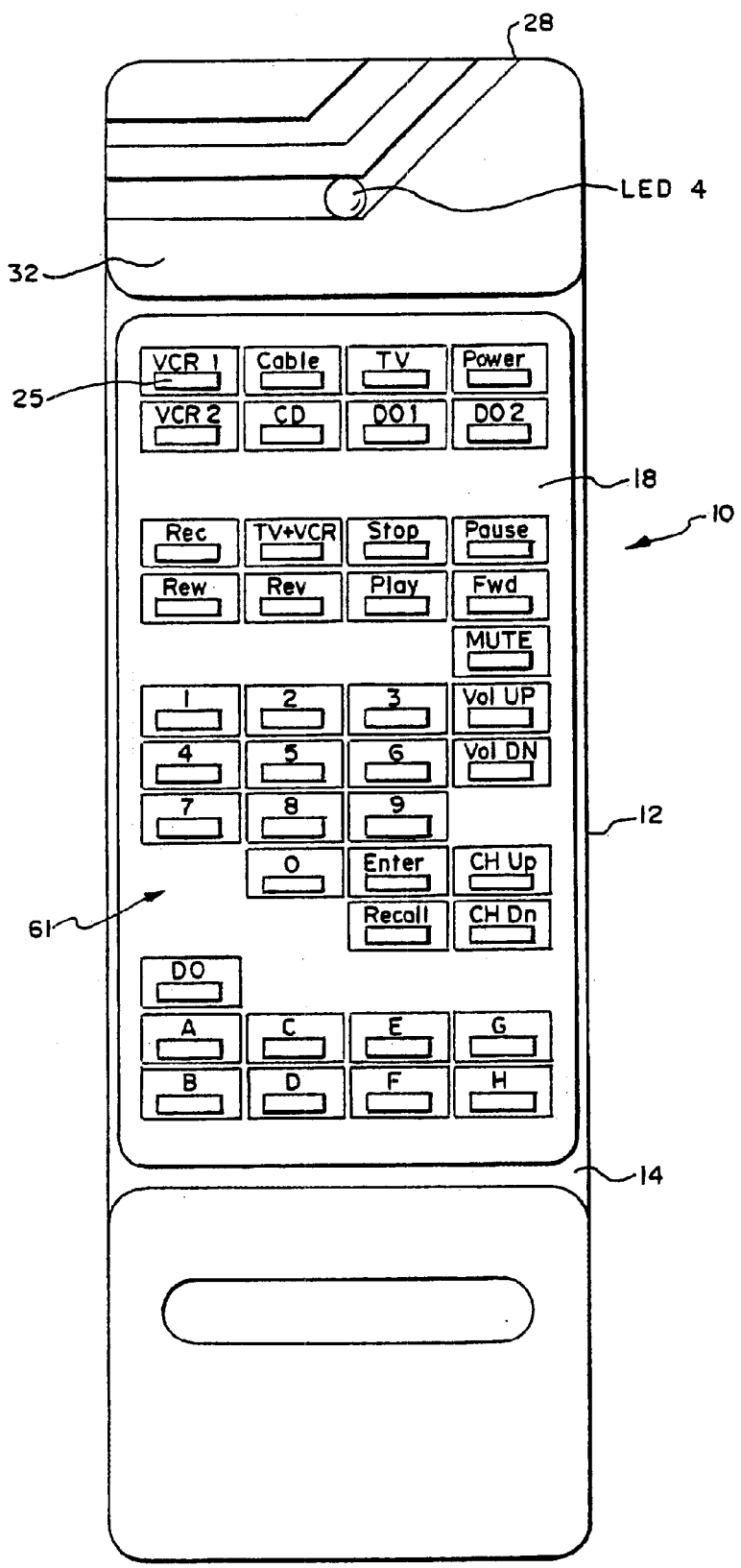
FIG. 15 is a front plan view of the control device shown in FIG. 1 and shows the various pushbuttons of the device.

This arrangement is shown in FIG. 15 and the manner in which these pushbuttons 25 are utilized in operating the control device 10 will be described in greater detail in connection with the description of FIGS. 15–19B.

At a top or forward end 28 of the device 10, there is provided an opening 30 for three light emitting diodes, LED 1, LED 2 and LED 3. The opening 30 is covered by an infrared-transport lens 31. Also, provided on a top surface 32 of the upper housing member 12 of the control device 10 is a light emitting diode, LED 4, by which information, in the form of red and green blink codes, is communicated to the user of the device 10.

FIG. 2 is an exploded view of the components of the device 10. As shown, the device 10 includes the overlay face panel 18 with pushbutton-receiving, generally rectangular openings 22, the upper housing member 12 with base panel 14 having a plurality of generally rectangular, pushbutton receiving openings 24, the elastomeric body panel 26 having pushbuttons 25 extending from an upper surface 34 thereof, a printed circuit board 36 having conductive switches 38 on an upper surface 40 thereof and operating circuitry 42 (FIG. 7) mounted on the underside 43 thereof, the lower housing member 16, a cover 44 for a battery compartment 45 (FIG. 7) for receiving batteries 46 (FIG. 10) for the circuitry 42 of the control device 10, and the infrared-transport lens 31.

It will be noted that the base panel 14 of the upper housing member 12 has pushbutton openings 24 completely across each one of fourteen (14) rows across and four (4) columns down. However, not all of these openings or holes 24 have pushbuttons 25 extending therethrough, as noted by the lesser number of pushbutton-receiving openings 22, in the overlay face panel 18. Likewise, the body panel 26 initially has pushbuttons 25 arranged completely across the upper surface 34 thereof in fourteen (14) rows across and fourteen (14) columns down.

The printed circuit board 36 has conductive switches 38 aligned with each one of the pushbuttons 25 so that more switches 38 are provided than may be necessary for this particular control device 10.

The availability of additional pushbutton openings 24 in the base panel 14 will enable the control device 10 to be modified as necessary by the addition of further pushbuttons 25 to perform numerous other functions as called for.

This mechanical construction of the upper and lower housing members 12 and 16 and the panels 14 and 18 and circuit board 36 enable the control device 10 to be modified to include additional circuits in the operating circuitry 42 and pushbutton switches 25 for performing additional functions, if desired. In this respect, overlay face panel 18 is easily replaceable to modify the device 10 to include more or less pushbuttons 25 and associated switches 38.

The simplicity of the construction of the pushbuttons 25, the base panel 14 and the overlay panel 18 is shown in FIGS. 3–6. As shown in FIG. 3, the body panel 26 has a plurality of raised pushbuttons 25 formed thereon. Each raised rectangular button 25 has a recessed area or hollow 48 on the underside 49 of each button 25 in which is mounted a conductive plunger or puck 50 adapted to engage one of the conductive switches 38 on the circuit board 36. With the pushbuttons 25 and the panel 26 being formed from a sheet of elastomeric material it is an easy matter to remove the buttons 25 that are not necessary with a scissors or other cutting element, as shown in FIG. 4.

Then, the pushbutton body panel 26 is moved into engagement with the base panel 14, as shown in FIG. 5, to form the assembly shown in FIG. 6.

After the pushbutton body panel 26 and the base panel portion 14 have been assembled as shown in FIG. 6, the overlay face panel 18 is mounted on top of the base panel 14 and the circuit board 36 is mounted within the housing member 12.

Figure 7:
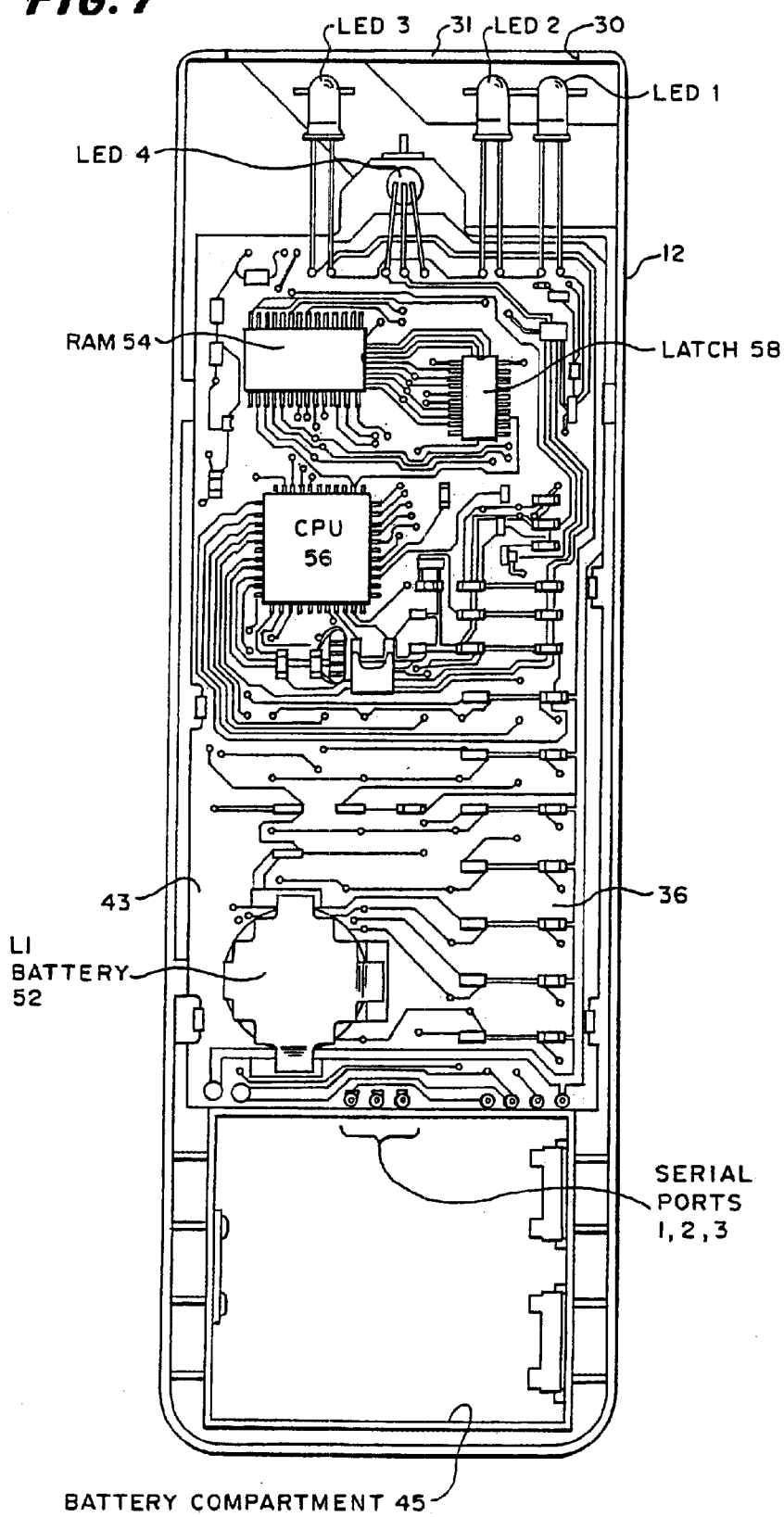
FIG. 7 is a plan view of the circuit board assembly mounted inside the control device viewing the control device from the back side thereof with a back cover panel removed.

Referring now to FIG. 7, there is illustrated therein the operating circuitry 42 of the control device 10 which includes batteries 46 (FIG. 10) mounted in the compartment 45 for providing power for the circuitry 42 and a lithium battery 52, which backs up a statuc RAM 54. A central processing unit (CPU) 56, is coupled through a latch 58 to the RAM 54. Three LEDs, LED 1, LED 2, and LED 3 are coupled to the circuitry 42 for communication with the apparatus to be controlled. All elements of the circuitry 42 are mounted on the circuit board 36 mounted in the upper housing member 12. A further LED, LED 4 is coupled to CPU 56 for communication with the user of the device 10 as will be described in greater detail below.

Figure 8:
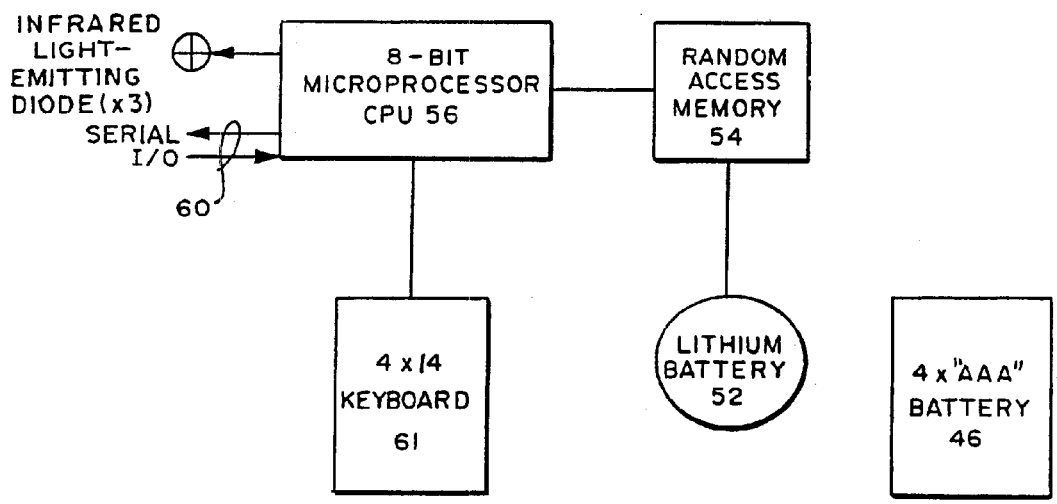
FIG. 8 is a block diagram of the operating circuitry in the control device.

A block schematic circuit diagram of the operating circuitry 42 is shown in FIG. 8 and includes CPU 56, the infrared light emitting diodes, LED 1, LED 2, and LED 3 coupled to the CPU 56, serial input/output ports 60 of CPU 56, the RAM 54 coupled to CPU 56 and backed up by lithium battery 52 and a 4×14 keyboard 61 coupled to CPU 56. The four AAA batteries 46 are also shown.

Figure 9A:
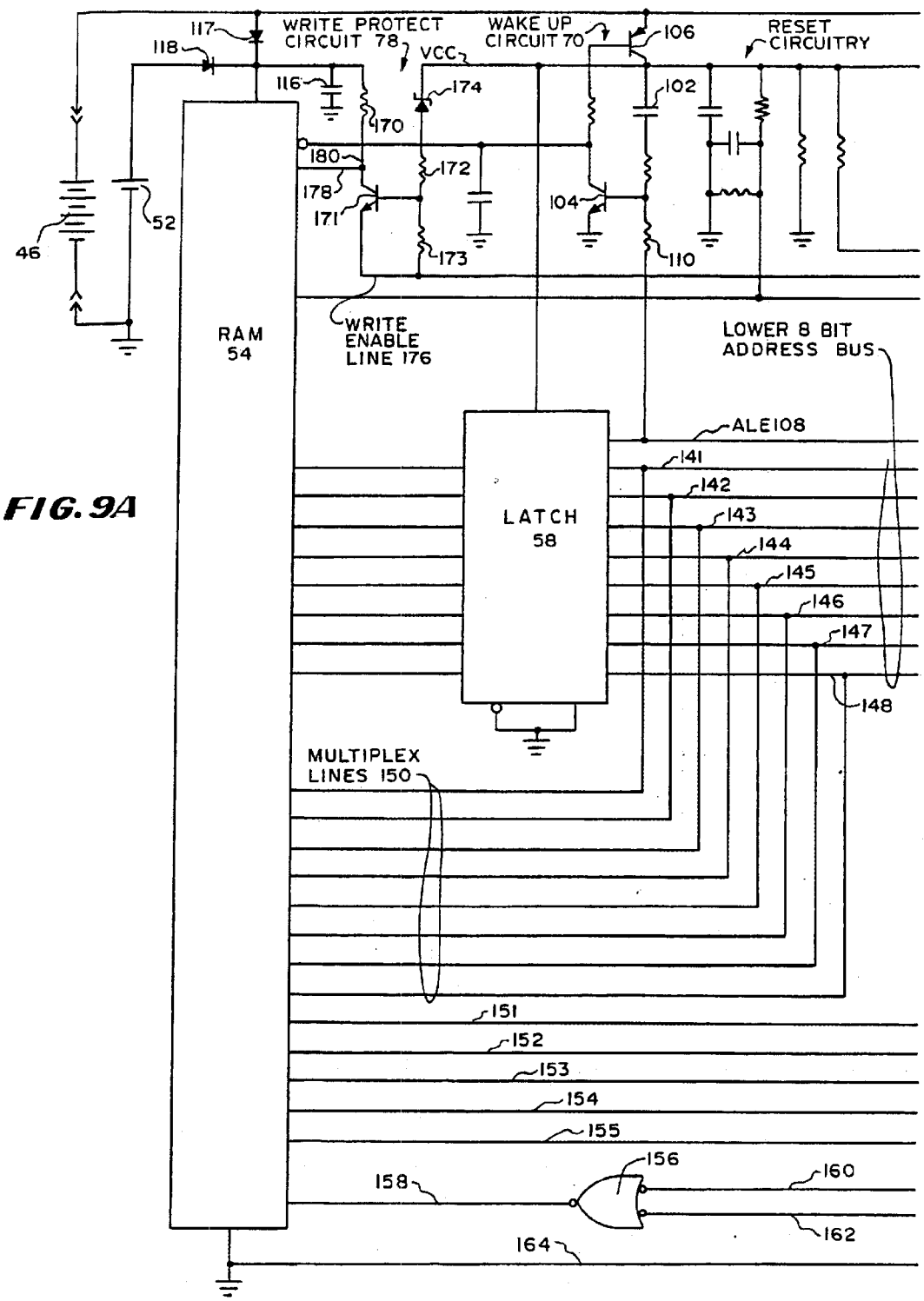

FIGS. 9A and 9B are a detailed schematic circuit diagram of the operating circuitry 42. The operating circuit 42 includes the central processing unit 56, the latch 58, the random access memory 54 and LED 1, LED 2, LED 3 and LED 4.

The operating circuitry also includes several subcircuits. One of those subcircuits 62 (FIG. 9B) includes the keyboard 61 having pushbuttons 25, each of which is connected to a port 63 of the CPU 56 shown in FIG. 9B and can be referred to as the keyboard circuit 62. The X's in FIG. 9B indicate the pushbuttons 25 and when one of those pushbuttons X is pressed, current flows through a resistor in a column line, e.g., when button 25' is pressed current flows through resistor 64 in column line 138 going to the button or key 25'. That raises the voltage on a supply line VCC to the CPU 56 of the microprocessor.

Accordingly, whenever a button 25 is pressed, it will increase the voltage on line VCC which initiates a switching process in a wake up circuit 70 for "waking up" or energizing the CPU 56 in the manner described below.

In addition to the keyboard circuit 62 and the walk-up circuit 70, the subcircuits include a reset circuit 74, and a write protect circuit 78.

When the voltage on line VCC goes up, a signal is passed through capacitor 102, to the base of a transistor 104 in the wake up circuit 70. This turns on the transistor 104 which in turn turns on transistor 106 This turning on of the transistors 104 and 106 will bring voltage on line VCC to the full DC voltage of about 51/2 volts. When the voltage on line VCC reaches 51/2 volts, the CPU 56 begins to operate.

When operating, the CPU 56 establishes a signal on line ALE 108 which is passed through a resistor 110 and filtered by capacitor 102. Once the ALE signal is established, it causes a voltage to be generated at the base of transistor 104, maintaining transistor 104 turned on, which in turn maintains transistor 106 turned on, thus enabling the CPU 56 to continue to run. The CPU 56 can turn itself off by executing a HALT instruction which causes the ALE signal to cease, thus turning off transistors 104 and 106 and removing power via line VCC to the CPU 56.

It is to be noted that the wake up circuit 70 can be activated by depression of a key or button 25 or by an input signal at serial port 3 coupled to an input port 112 of the CPU 56.

The circuit elements described above form the walk-up circuit 70 for activating the operating circuitry 42 of the device 10. This circuit uses substrate static-protection diodes 114 in a CMOS chip coupled to the keyboard 61. With this arrangement, source current is supplied to transmitter 104 via line VCC when a key or pushbutton 25 is depressed.

The RAM 54 is connected to the lithium battery 52 and, when the device 10 is not being used, draws about 20 nanoamps from the battery 52, which gives the device 10 a shelf life between 5 and 10 years. A backup capacitor 116 is coupled to the RAM 54 and has (at 20 nanoamps) a discharge time of about 10 minutes, providing ample time to change (if necessary) the battery 52 without losing the instructions and data stored in the RAM 54. Capacitor 116 is kept charged by battery 46 through diode 117 when the device 10 is operating and, at other times, by battery 52 through diode 118.

After the CPU 56 has been powered up, or awakened, the CPU 56 makes a scan of row lines 121–128 to the keyboard 61 by sequentially forcing each line 121–128 low and then polling the other lines to find out which button 25, such as button 25', has been pressed. As a result of pushbutton 25' being pressed, a low impressed upon row line 121 will cause a low on column line 128 and that will result in the row line 128 being low.

The CPU 56 first sets row line 121 low and then begins scanning, starting with the row line 122, for another row line having a low voltage thereon and by finding the row line with the low voltage, in the above example, row line 128, the CPU 56 knows that button 25' at the intersection of row line 128 and column line 138 has been depressed.

If the CPU 56 had not found a low on another row line, such as row line 128, after having set line row 121 low, line 121 is returned to its previous value and row line 122 is then set low, and the scan continued until a low row line is found to identify which button 25 has been depressed.

When the CPU 56 determines which pushbutton 25 has been depressed the CPU 56 will then know what function is to be carried out.

It is to be noted that the keyboard circuit 62 is uniquely designed to include only eight (8) row lines 121–128 and eight (8) column lines 131–138 each having a resistor 64 and a current directing diode 114 therein and each being arranged across the row lines 131–138 so that 56 switch positions are provided with only eight (8) lines.

All memory cycles exercised must involve the latch 58 because the CPU 56 has its data bus multiplexed with the lower 8 bits of the address bus on lines 141–148.

Coming out of the CPU 56 to the latch 52, is a group of nine (9) lines 108 and 141–148. One of the lines, line 108, carries the ALE signal. The eight (8) lines 141–148 between the latch 58 and the CPU 56 are the multiplexed data and address bus lines. These lines comprise the lower 8 bits of the address bus. A group of multiplex lines are identified with reference numeral 150. Five more lines 151–155 comprise the upper five bits of the address bus, making a total of 13 bits of address.

An inverting OR gate 156 having an output line 158 and two input lines 160 and 162 together with ground line 164 are coupled between the CPU 56 and the RAM 54. The line 158 defines an output enable for the RAM 54.

Accordingly, when the CPU 56 wants to do a read, it actuates either of the two input lines 160 or 162 going into the OR gate 156. Line 160 is a PSEN line for telling the RAM 54 that it is to be enabled to receive data and line 162 in a Read Output line to tell the RAM 54 that the CPU is going to read the information stored in the RAM 54. With OR gate 156 the two lines and functions are combined on one line 158. In other words, the CPU 56 tells the RAM 54, through the OR gate 156, that it wants to read information stored in the RAM 54.

The circuitry 42 also includes the write protect circuit 78 which has the double duty of being a low battery indicating circuit. The circuit 78 includes a resistor 170, a transistor 171, two resistors 172, 173 and a Zener diode 174 connected as shown.

A write enable line 176 is connected between the transistor 171 and the CPU 56.

When the CPU 56 desires to write information into the RAM 54, it places the address on the address bus lines 141–148 and 151–155, strokes the lower 8 bits of the address bus on lines 141–148 into the latch 58 using ALE line 108, places the information on the data bus lines 141–148, and then brings the write enable line 176 low.

When the write enable line 176 goes low, unless the transistor 171 is turned on by virtue of the battery voltage being more than 4.3 volts, a line 178 going into the RAM 54 at the collector 180 of the transistor 171 (which is the "write enable" for the RAM 54), is prevented from going low, maintaining the RAM "Write Protected". This condition also is created when the battery 48 is low. The "write enable" line 176 also functions as a low battery detector because, during execution of the program, a check is made to see whether writing to the RAM 54 is enabled. If it is not, this shows that the batteries are weak and a signal is sent to the user by flashing the red LED, of LED 4, 5 times.

Note that LED 4 includes a red LED and a green LED incorporated into one package so that when both LEDs are turned on, a yellow light is emitted, making LED 4 a tricolor LED. Such tricolor LED 4 enables the device 10 easily to communicate to the user by way of the color, number and sequence of light blinks.

A clock circuit 182 including a crystal resonator is coupled to the CPU 56.

Three serial ports 1–3 are coupled to the CPU 56 and include port 1 which is a transmitting port, port 2 which is ground and port 3 which is a receiving port. Serial port 1 is connected to row line 121 so that data can be serially transmitted in the form of highs and lows by CPU 56 from the RAM 54 over row line 121 to serial port 1. Incoming data is received serially at serial port 3 and conveyed to input port 112, when it is desired to update the code data and/or instructions in the RAM 54.

The three infrared-emitting LEDs, LED 1, LED 2, and LED 3 are connected in the circuitry 42 as shown.

The reset circuit 74 includes two resistors and a capacitor connected as shown and coupled between line VCC and a reset line 184.

As will be described in greater detail in connection with the description of FIGS. 11–14, the manufacturer of the device 10, using known methods or the method described herein with reference to FIGS. 12A–13C, will decipher the infrared codes for operating various pieces of equipment, such as a TV, a VCR, a CD, a Cable Converter or other equipment which is controlled by a remote infrared transmitting device.

After the infrared code is deciphered, the code data theefor and instructions for generating such code (see the flow chart in FIG. 14) are stored in a programming computer 200 (FIG. 10) and the device 10 is programmed as explained below.

It is to be noted that the circuitry 42 has no ROM and all instruction codes and code data are loaded directly into the RAM 54. This allows for infinite upgradability in the field via the serial ports 1, 2, 3.

Figure 10:
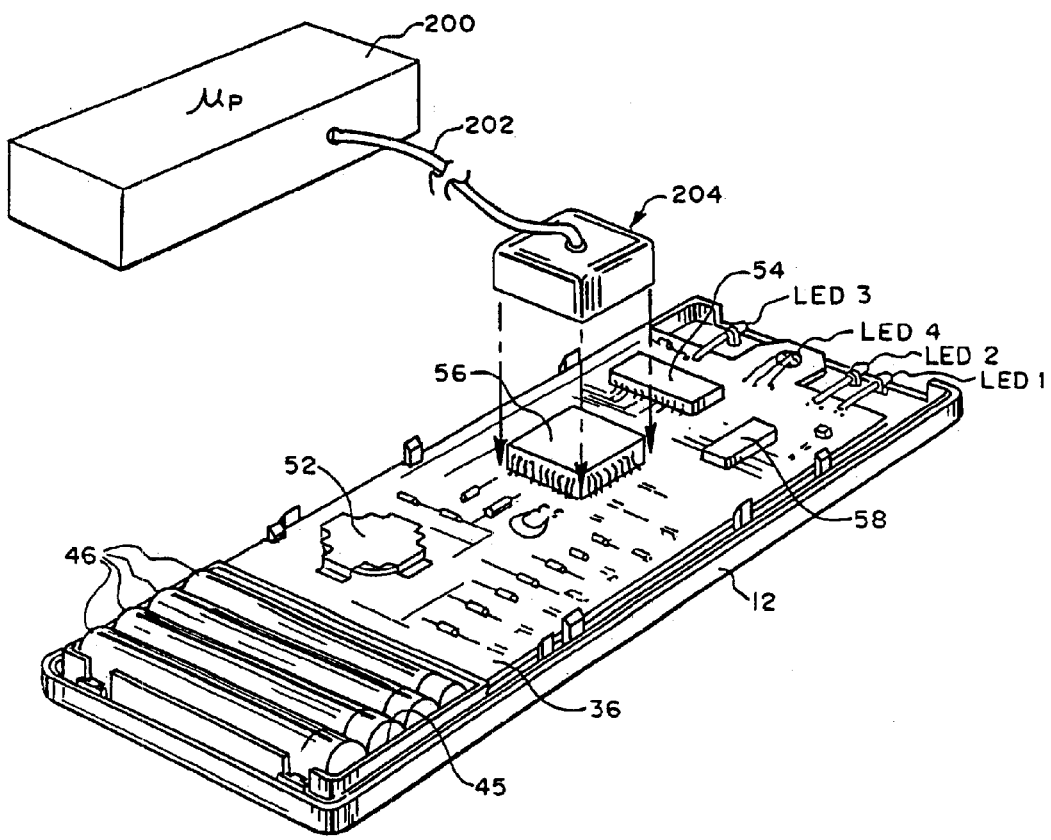
FIG. 10 is a perspective view showing the connection of a programming connector over the central processing unit of the operating circuitry in the control device, the programming connector being connected to a microprocessor, being operable to disable the central processing unit, and being used to program the random access memory (RAM) of the operating circuitry.

FIG. 10 is a perspective view of a programming computer 200 coupled by a cable 202 to a special connector 204 which is adapted to be received over the CPU 56 in the operating circuitry 42 for disabling the CPU 56 and for enabling the RAM 54 to be programmed by the programming computer 200. Essentially this is done by tri-stating the CPU 56 and placing the RAM 54 into the address space of the computer 200 which writes initial instruction code including code for the serial port driver, and subsequently serially, other instruction code and code data into the RAM 54. For this purpose the programming computer 200 has instruction codes such as serial port driver instructions and data relative to the infrared codes for operating a multiple number of electronic apparatus, such as televisions, VCR's, etc stored therein. Signals from the programming computer 200, via the connector 204 causes the inputs and outputs 60 of the CPU to be disabled so that instruction codes and data can be input into the RAM 54 quickly and efficiently from the programming computer after the operating circuitry 42 is mounted in the control device 10.

Later, after the device 10 has been in use for some time and the RAM 54 needs to be updated with instruction codes and data relative to new equipment on the market, the control device 10 can be simply and easily updated at a service outlet having an ordinary personal computer with a serial port using a novel nine pin to three pin, 9 volt to 5 volt, signal coupling and converting assembly 206 (FIG. 20). The updating can be done by adding to the data in RAM 54 or by rewriting (writing over) the data in RAM 54. The assembly 206 is described in greater detail hereinafter in connection with the description of FIGS. 20–22.

The infrared codes to be learned include a wide range of different codes for operating different electrical apparatus manufactured by the same or different manufacturers. In FIG. 11, which is identical to FIG. 1 in U.S. Pat. No. 4,623,887, there are illustrated several modulation schemes for infrared codes. FIGS. 11a–11g illustrate different types of gated carrier frequencies. Typical carrier frequencies for infrared remote transmitters are 20 Khz to 45 Khz, with the majority being at 38 Khz and 40 Khz. The gating schemes illustrated include both fixed and variable bit periods, non-return to zero (NRZ), variable burst widths, single/double burst modulation schemes, and a final catch-all category called random because there is no readily distinguishable pattern of ones and zeros.

In addition to these schemes, there is also a transmitter which puts out a different continuous frequency (CW) for each key as represented in FIG. 11h.

Finally, several new types of transmitters do not use a carrier frequency at all but instead send a stream of pulses where the dat is encoded in the spaces between the infrared pulses as shown in FIG. 11i.

Data modulation schemes for most transmitters have a higher level of data organization which may be called a keyboard encoding scheme which causes different data to be sent depending upon the transmitter and the key pressed. This will be described in greater detail hereinafter in connection with FIGS. 15–19.

The code data for the infrared codes may be obtained from vendor information sheets and specifications, can be determined using the methods disclosed in U.S. Pat. Nos. 4,623,887 and 4,626,848, or by the method disclosed herein.

In the method for learning or acquiring code data for infrared codes disclosed herein, no counting of pulses is carried out. Instead the method involves the following steps:

(a) receiving a transmission of a train of pulses from a remote control transmitter;

(b) recording the point-in-time of an edge of each pulse in a train of the pulses;

(c) transforming the recorded point-in-time data into a list of instructions for generating a replica of the train of pulses;

(d) timing the duration of a train of the pulses;

(e) timing the period between trains of pulses;

(f) associating a function key of the universal remote control device 10 with the time duration of the train of pulses and the list of instructions for generating a replica of the train of pulses;

(g) determining whether or not repetitions of the transmission of train of pulses is present;

(h) ignoring repetitions of the train of pulses;

(i) noting that repetitions are present; and (j) storing for use in a universal remote control device, the information acquired in steps (c), (d), (e), (f) and (i).

Typically, each pulse has a fixed duty cycle and in carrying out the above described method it can be assumed that each pulse has a fixed duty cycle.

Figure 12A:
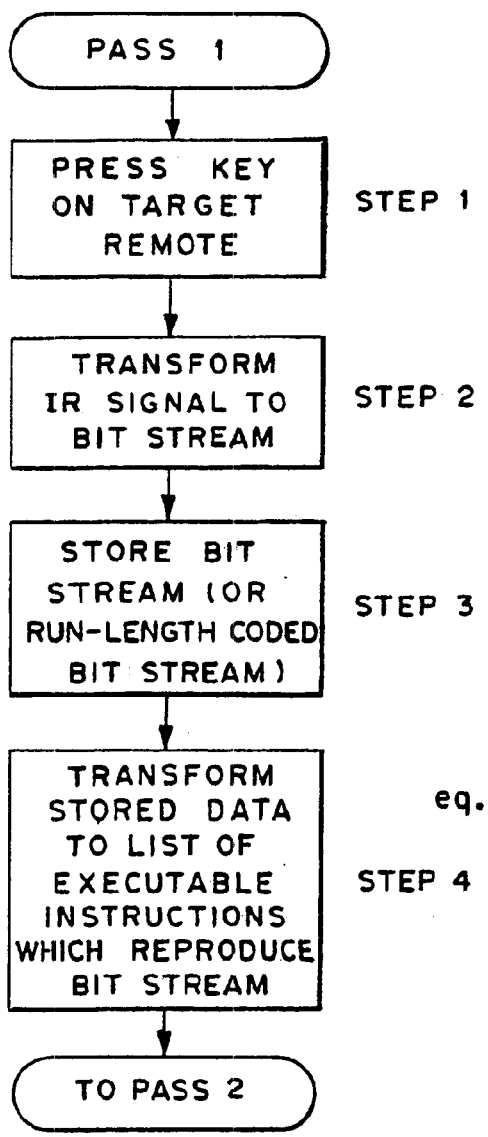
FIG. 12A is a flow chart of a first part of a method for capturing an IR code and FIG. 12B is a graph of the envelope of the code.

The manual and computer steps followed in practicing this method are set forth in FIGS. 12A and 13A.

Figure 12B:
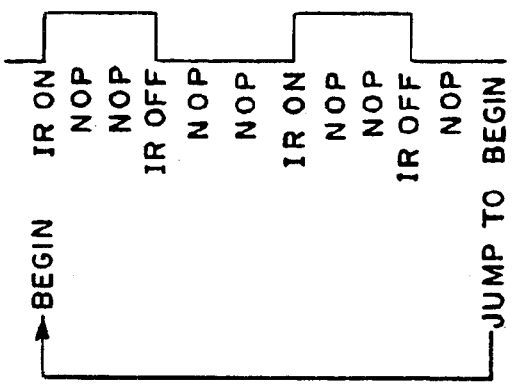

FIG. 12A is a flow chart of the first part of this method for capturing an IR code and FIG. 12B is a graph of a pulse train comprising a portion of the code.

There is shown in FIG. 12B, adjacent the transforming step in FIG. 12A, a graph of the waveform of the captured, and later recreated, infrared codes, showing when the infrared signal is on and when it is off. When the CPU 56 executes the instructions set forth below the waveform in FIG. 12B, infrared-emitting LEDs, LED 1, LED 2, and LED 3 are turned on when the instruction IR-ON is executed and turned off when the instruction IR-OFF is executed. No operation is performed when the instruction NOP is called for. In this way the infrared codes are transformed into a bit stream of 0's and 1's.

FIG. 13A is a flow chart of a second part of the method for capturing an IR code.

FIG. 13B shows the IR infrared bitstream and an envelope of the filtered bitstream.

FIG. 13C shows the filtered waveform that is analyzed for repetition. The repetition scheme and a pointer to indicate, upon regeneration of the infrared code, wnhich key will generate that code are stored in a memory for later inputting into the RAM 54.

FIG. 14 is a flow chart of a sequence of eleven (11) steps that a user initiates to generate a specific IR code for performing a specific function, namely, for generating a captured IR code stored in the remote control device 10. The code data is stored in the RAM 54 of the remote control device 10 and the sequence of steps the circuitry 42 goes through to take the code data in the RAM 54 and generate the infrared code therefrom is set forth in this Figure.

FIG. 15 is a plan view of the keyboard 61 and shows the different keys or pushbuttons 25 of the control device 10 extending through the base panel 14 of upper housing member 12 and the face panel 18 where the label or identification for each pushbutton or key 25 is shown. The light emitting diode, LED 4, is also indicated.

Figure 16:
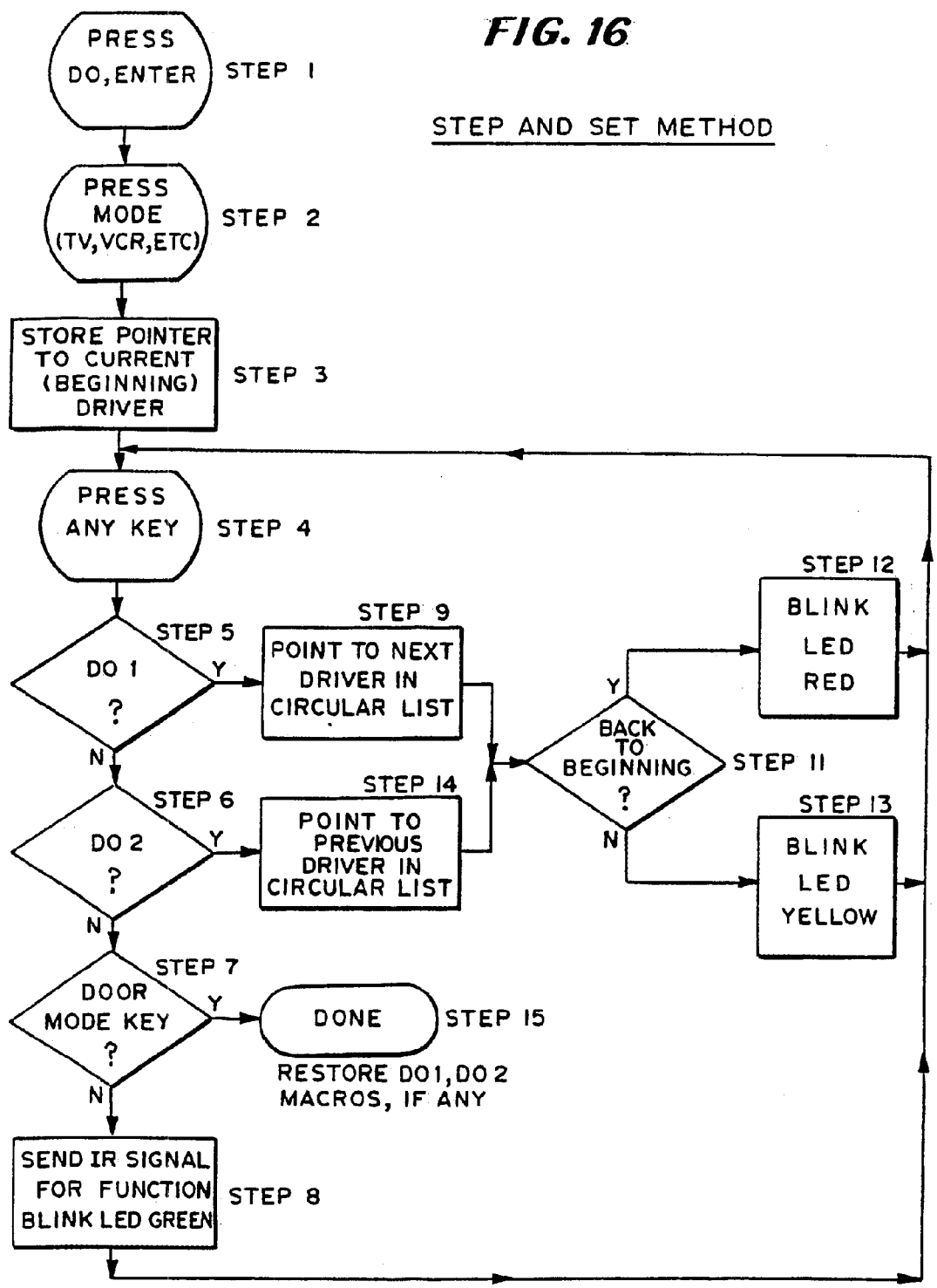
FIG. 16 is a flow chart of the search and set procedure followed in using the control device of the present invention.

FIG. 16 is a flowchart of the steps initiated by a user of the device 10 in a step and set procedure for searching for code data in the device 10 for the infrared code needed to operate the user's specific apparatus and to set the device 10 for that code data.

Figure 17:
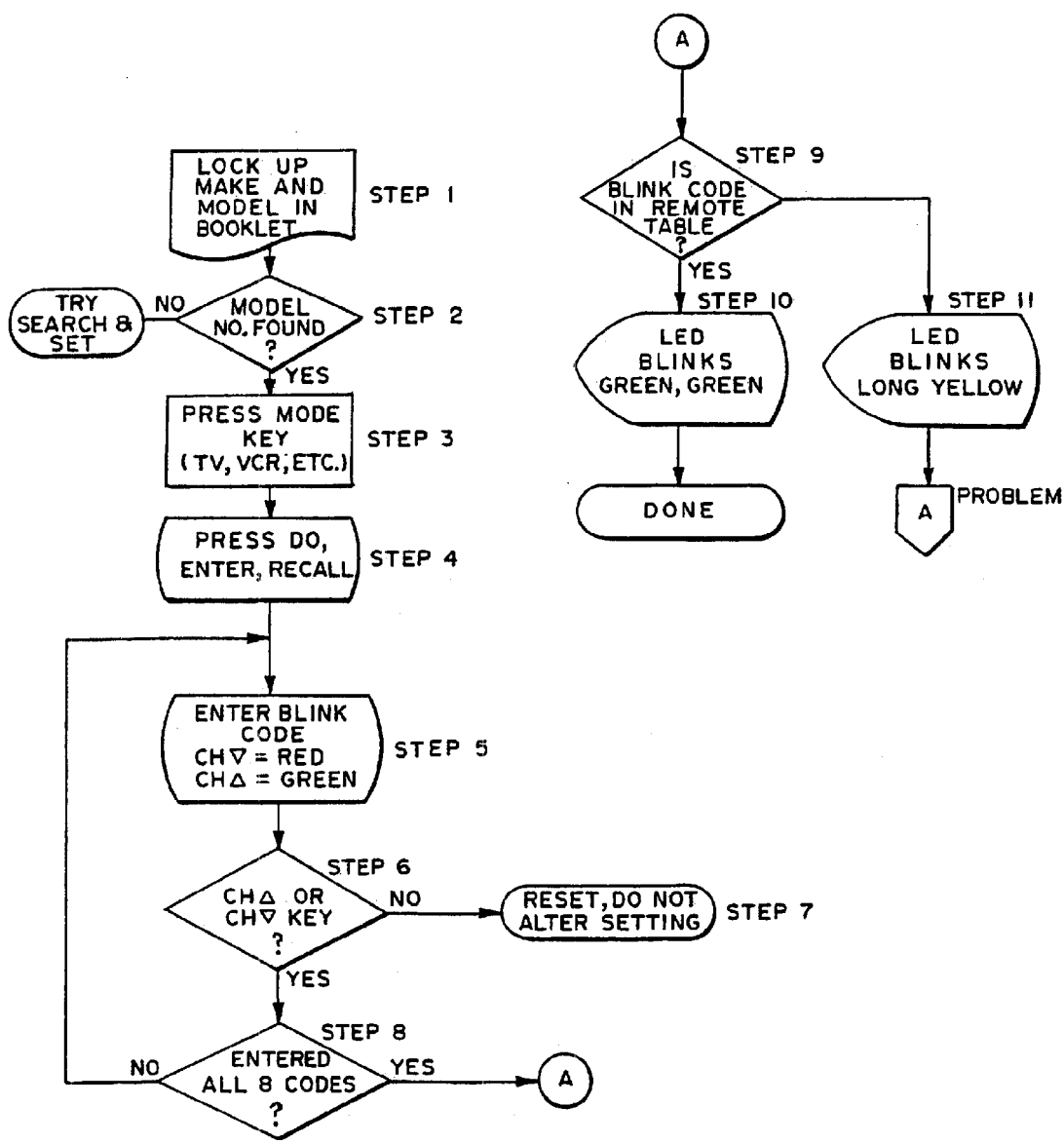
FIG. 17 is a flow chart of a direct-entry/quick-set procedure followed in using the remote control device.

FIG. 17 is a flow chart of the steps initiated by a user in carrying out a direct-entry/quick-set procedure for matching the user's equipment or apparatus to the device 10. The steps of this procedure include:

STEP 1. Look up make and model number of the controlled apparatus in a table provided to the user in an instruction booklet STEP 2. Model number is found and matched with a series of 8 "R"s and "G"s.

STEP 3. Here the operator presses the desired mode button or key.

STEP 4. Press DO, Enter, Recall. This tells the device 10 to do a Quick-Match.

STEP 5. Next enter the sequence of eight red and green blinks found in TABLE I (set forth below) provided in the instruction booklet. This is done by pressing Channel Down for "R" and Channel Up for "G".

STEP 6. Here a determination is made if a key other than Channel Up or Channel Down, was pressed.

STEP 7. The device 10 tricolor LED 4 will flash red or green depending on what button is pushed.

STEP 8. When all eight codes are entered, the program goes on to STEP 9.

STEP 9. Here a check is made to see if the blink code is in the table in the RAM 54 of the remote control device 10.

STEP 10. If the device 10 has successfully Quick-Matched to the controlled apparatus, the LED 4 will flash green twice.

STEP 11. If it did not match, it will flash yellow indicating that codes for that controlled apparatus are not loaded into the RAM 54.

TABLE I

DEVICE BLINK CODES AND SPECIAL FEATURE BUTTONS
Blink Code
    A B C D E F G H
TELEVISION SETS
RRRR RRRR
    Display
        MTS    Pict + Pict − Sleep TV/Video
                          Ant Tone
    25 = Col Up
        26 = Col Dn
            27 = Brt Up
                28 = Brt Dn
                    29 = Hue Up
                        30 = Hue
                            31 = Mtx
                                32 = Reset
                Dn
RRRG RRRG
    Screen Sp Phne/
            AutoOn/ AutoOff/
                      Ant Stereo
    Dn Prnt Ctl
        Data Ent
            Data Clr
RRRG RGRG
    Add Clear
RRRG GRRR
    A Ch Hi Fi
RRRG GRGR
    Ant/Aux
        Time/Ch Program TV/VCR
RRRG GGGR
    Ant/Aux
        Time/Ch
RRRG GGGG
    Pwr On Pwr Off Display Ant
GRRG RRRG
    Aux Last Ch Timer
GRRG RRGG
    Fine Up
        Fine Dn L Ctl R Ctl OBC Func Review
                                      BiLing
    25 = Stereo
        26 = TimeFa
            27 = Timer
                28 = TimeSl
                    29 = TV/AV
GRRG RGRR
    Fine Up
        Fine Dn L Ctl R Ctl OBC Func Review
                              BiLing
    25 = Stereo
        26 = TimeFa
            27 = Timer
                28 = TimeSl
                    29 = TV/AV
GRRG RGGR
    Tint R Tint L Color R Color L
                Contr R
                      Contr L
                          Timer Stereo
    24 = SAP
        25 = Reset
            26 = Q/V
                27 = EXP
                    28 = Disp
                        29 = Mono TABLE I-continued 30 = Lock
                            31 = TV
    32 = Ext 1
        33 = Ext 2
            34 = Ant
GRRG GRRG
    TV/Video
        Time
GRRG GRGR
    TV/Video
        Wide Lvl Up Lvl Dn Memory Func MTC Stereo
    25 = Timer
        26 = 100
            27 = BiLing
GRRG GRGG
    10 11 12 13
GRRG GGRR
    RF12 Ch Rtn Str SAP Mono Timer T Set TV/CATV
                                              TV/Vid
    26 = 100
        27 = Audio
            28 = CCC1
                29 = CCC2
                    30 = CCC3
                        31 = 32 = 33 =
    34 = Pict
        35 = Reset                CCC4 ContDn
                                    ContUp
GRGG RRRR
    Sleep Review
GRGG RRRG
    K L
GRGG RRGR
    SAP Sleep TV/Video
GRGG RRGG
    Program
        Q Rev SAP Sleep TV/Video
                                Add Delete
GRGG RGRG
    Sleep St/SAP TV/Video
GRGG RGGR
    11 12 13 14 15 16
GRGG RGGG
    K L
GRGG GRRR
    K L
VIDEO CASSETTE RECORDERS
RRRR RRRR
    Nse Cncl
RRGR RRRG
    Ant
RRGR RRGR
    Ant
RRGR RRGG
    Frm Adv
        Slow Slow Up Slow Dn
                      Srch Fwd
                          Srch Rev
RRGR RGRR
    A B C D E F Slow
RRGR GGGR
    Slow
RRGR RGGR
    Slow + Slow − Eject CM Skip
                        Program
                              Input Mode AM/PM
    28 = Shift
        29 = Reset
            30 = Mem/PS
                31 = SR
RRGR RGGG
    Forward
        FlshBack
            Ant Vol + Vol − Reverse
                      Sp Phne
                      PC TABLE I-continued RRGR GRRR
    Ant/Aux
RRGR GRRG
    11 12 13 14 15 16
RRGR GRGR
    Frm Adv
        Memory Reset Chg Time
RRGR GGRR
    Pwr On Pwr Off
RRGR GGGG
    Slow Slow Up Slow Dn Set Up Set Dn Timer Clear Display
        29 = Frame
            30 = Memory
                31 = Prog
                    32 = Qtr
                        33 = QtrStr
                            34 = Quick
                                35 = 36 = Rst
    37 = Clock
        38 = APS
            39 = 100            Remain
GGRG RRRR
    K L
GGRG RRRG
    CFM Slow
GGRG RRGR
    Slow OSP Shift L Shift R
        Slow Dn
            Slow Up
                St + St –
    28 = Timer
GGRG RRGG
    11 12 13 14 15 16 Slow
GGRG RGRR
    Slow Dn
        Slow Up Slow
CABLE CONVERTERS
RRRR RRGR
    A/B Add Delete Set Lock Last Ch
RRRR RRGG
    A B Event(*)
        # Arrow Up
            Arrow Dn
                AP Delete
    25 = F 26 = K 27 = Learn
            28 = PGM
                29 = TCP
                    30 = Enter
RRRR RGRR
    Skew L Skew R Audio SAT Ant East
                                  Ant West
RRRR RGRG
    Plus Minus Dot Box Str Clear Time Auth
    22 = C/R
        23 = #
RRRR RGGR
    Prog Auth
RRRR RGGG
    Auth
RRRR GRRR
    Auth Prog
RRRR GRRG
    Plus Minus Rcp * M1 M2 M3 M4
RRRR GRGR
    A-B Dot1 Dot2 * Am Dm F
RRRR GRGG
    Arrow Up
        Arrow Dn
COMPACT DISK PLAYERS
RRRR RRRR
    CD Fwd CD BckUp
GRRG GRGG
    Fwd Indx
        Rev Indx
            Repeat Memory For numbered functions, press "DO" then the two digit number.

FIG. 18A is a flow chart of the steps for setting a "DO" command macro, for achieving a function that normally requires the actuation of several buttons, by programming one particular button to perform the functions required of the several buttons to achieve a specific function.

FIG. 18B is a flowchart of the simple two pushbutton steps required for executing the "DO" macro command created in FIG. 18A.

Figures 19A, 19B:
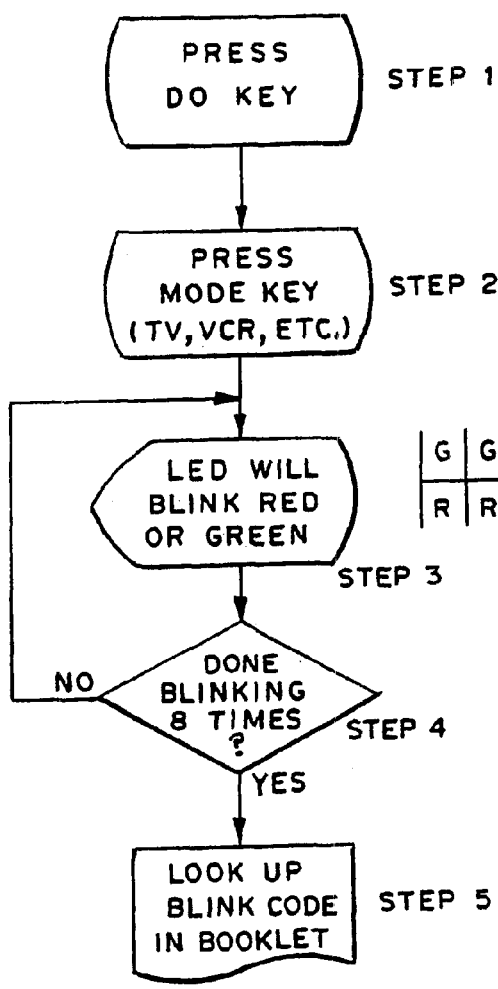
FIG. 19A is a flow chart of the method used to identify what type of unit the remote control device is set for and FIG. 19B is a table of the identifying blink code.

FIG. 19A sets forth the steps initiated by a user to determine the various blink codes which identify what equipment or apparatus the remote control device 10 is set for.

FIG. 19B illustrates a sample blinking grid of eight red and green blinks which will be presented o the user. Once a particular pattern of eight red or green blinks has taken place, the user of the device 10 will look up the blink pattern or code in TABLE I included in a user handbook. This table shows the user which pushbuttons 25 labeled A–H are associated with additional functions stored which may be stored in the RAM 54. Additional functions beyond the eight supported by pushbuttons A–H are performed by pushing "DO", and then the two-digit sequence shown in TABLE I.

The instructions for using the control device 10 which are supplied to a purchaser thereof in an instruction booklet are set forth below.

Matching the Device to Your Equipment

The device 10 can control most remote controlled TV's, VCR's, cable converters, and CD players, but it needs the user's input to match it to your particular equipment. The easiest way to do this is to STEP-and-SET your device 10. You will only need to do this once for each different type of device you have.

1. To STEP-and-SET your device 10, first press DO, Enter.

2. Press one of the following equipment selection buttons to tell the device 10 what kind of equipment to match.

| VCR1 | Cable | TV |
| VCR2 | CD | |

3. Aim the device 10 at the equipment and try various function buttons to see if the equipment responds correctly. Make sure you are reasonably close to the equipment and that nothing is blocking the path. The light (LED 4) at the top of the device 10 will shine green whenever it is sending an infrared code, or it will not light at all if it does not send a code for a particular button.

4. If your equipment did not respond correctly or did not respond at all, press DO1 to change the device 10 so that it will send the next set of infrared codes in its library, or press DO2 to change it so it will send the previous set of codes.

5. When your use DO1 or DO2 to step the device 10 setting forward or back, its light will blink yellow each time you step it. The settings step around in a circle. Whenever you get back to the setting where you started the device 10 light will blink red to notify you.

6. Use DO1 and DO2 to step through the sets of codes and keep trying out functions until your equipment responds correctly. The device 10 will fhen be set to send the proper infrared codes for operating your particular equipment.

7. When you are satisfied that the device 10 is properly matched, press DO, or any of the equipment selection buttons to restore the DO1 and DO2 buttons to their normal functions.

8. If your equipment is responding to your device 10 but some buttons are causing the wrong thing to happen, keep going. Some equipment responds to the infrared codes of other brands of equipment.

9. If your try out all of the codes in the device 10 library and your equipment still does not respond, it is probably because the code data for generating the infrared codes for operating your equipment is not in the library of your control device 10.

The Keyboard 61

Take a look at the keyboard. There are four groups of buttons:

1. Equipment Selection Buttons tell the device 10 which equipment is to be controlled:

| | | |
|---|---|---|
| VCR1 | Cable | TV |
| VCR2 | CD | |

2. Basic Function Buttons are used to control your TV, VCR, CABLE and CD. They work in much the same way as in older remotes which typically have the following buttons.

| | | | |
|---|---|---|---|
| | | | Power |
| | | | Pause |
| Rec. | TV.VCR | Stop | Fast Fwd |
| Rewind | Reverse | Play | Mute |
| 1 | 2 | 3 | Vol.Up |
| 4 | 5 | 6 | Vol.Dn |
| 7 | 8 | 9 | |
| | 0 | Enter | Chan.Up |
| | | Recall | Chan.Dn |

3. Extended Function Buttons perform any special fuinctions your equipment may have, such as color control, picture control, tint control, etc. These buttons are identified with the following alphabet letters.

| | | | |
|---|---|---|---|
| A | C | E | G |
| B | D | F | H |

4. DO Buttons are used to perform very powerful DO Commands which are explained below.

Special Features

Besides the basic functions such as channel up/down and volume up/down that most TV remote controls have, there could be special features as well, for example:

Color up/down.
Picture up/down.
Tint up/down.
Sleep.

Your VCR's remote control can also have special features such as:

Frame advance
Channel up/down

Your cable converter remote control can also have additional features such as:

Channel recall
Delete

Your CD player remote control can have special features such as:

Repeat
Track programming

Once you have matched the device 10 to your TV, VCR, Cable Converter and CD player, all functions that were controlled by your old remote control devices can now be controlled by the device 10. You may even notice some extra features that weren't controlled by your old remote.

Since the device 10 can control such a wide range of equipment, there is not enough room on it for buttons for every possible feature of every remote control. Instead, there are eight extended function buttons at the bottom labelled A through H. To find out what these eight buttons control for your particular TV, VCR, cable converter and CD player:

1. Get your pen and paper ready.
2. Press DO and then the button (TV VCR1 VCR2 Cable CD) of the device you want to know the special features of.
3. The device 10 will blink "red" or "green" 8 times. Every time it blinks "red" write down an "R". Every time it blinks "green" write down a "G". When you're finished writing it should look something like this:

RRRGRRRG

This is the "Blink Code" for your device. If your miss it the first time around, just press DO and the device button a second time.

4. Look at TABLE I and find the sequence of "R"s and "G"s that matches the one you wrote down.
5. Read the special features chart next to your Blink Code sequence which tells you what functions the A through H buttons control for your particular device.

For example, the feature chart of your TV might read:

| | |
|---|---|
| A: Color Up | C: Picture Up |
| B: Color Down | D: Picture Down |

6. To turn the color up in this example, you would press TV (of course if the device 10 is already set to control your TV, your do not have to press TV again but it doesn't hurt if you do so), then A.
7. To turn the color back down, you would just press B.
8. Write down what special functions are controlled by the A through H buttons on the handy stick-on labels enclosed with the control device 10.
9. After writing down the special functions on the labels, stick them on to the back of the control device 10 for quick and easy reference. If The Controlled Equipment Has More Than 8 Extended Functions Usually, the eight A through H buttons are enough for most controlled equipment. If they're not, don't worry. If your controlled equipment has more than eight special features these too are controlled by the device 10.

Beyond the A through H function buttons, any additional functions are performed by pressing DO then two of the 0–9 number buttons. For example, your TV's feature chart may show additional functions like these:

| | | |
|---|---|---|
| 25: SAP | 26: Reset | 27: Q/V |
| 28: Display | 29: Mono | 30: Stereo |

If you did have these features and wanted to use them, you would press DO and then the two-digit number for that feature. For example, you might:

Press DO,3,0. This would turn your TV's stereo broadcast feature on. If you use a feature like this frequently you may want to assign it to a DO command, our next topic of discussion.

Setting DO Commands

DO Commands give you the power to perform a multitude of different functions with the push of just one or two buttons. DO Commands let you assign any of the following buttons to tell the device 10 to automatically perform a series of keystrokes you use often:

|     | DO1<br>TV.VCR | DO2<br>Stop<br>Play<br>Mute<br>Vol.Up<br>Vol.Dn |     |
| --- | --- | --- | --- |
| Rec | Reverse | Chan.Up | Pause |
| Rewind | Enter | Chan.Dn | Fast Fwd. |
| A | C | E | G |
| B | D | F | H |

To tell the device 10 to do what you want, your must teach it. As an example, you can teach the device 10 to turn your whole system on and set the TV to channel 4 by doing the following:
 1. Press DO, Recall. This tells the device 10 that you want to teach it something to do.
 2. Next, your must assign a button 25 you will use to DO whatever you teach it. You can use any of the device 10's buttons 25 set forth above. For example, let's use DO1 at the top of the keyboard: Press DO1.
 3. Now, you must tell the device 10 what button sequence you would press to turn your whole system on and set the TV to channel 4.
 4. Press TV Power. This tells the device 10 to turn your TV on.
 5. Press 4, Enter (pressing Enter may not be required for your TV). This tells the device 10 to set your TV to channel 4.
 6. Press VCR, Power. This tells the device 10 to turn your VCR on.
 7. Press Cable, Power. This tells the device 10 to turn your cable converter on.
 Now you have pressed all the buttons you want the device 10 to learn for this example.
 8. Press DO, Recall. This tells the device 10 that you are finished teaching it and to remember what you have taught it.
 Now the device 10 knows how to turn your TV, VCR, and cable converter on and set the TV to channel 4, just by pressing one button.
 9. Aim the device 10 at your equipment and press DO1. Make sure you keep the device 10 pointed at your equipment while the light is flashing.
 Now that you know how DO Commands work, you can teach the device 10 to "DO" practically any sequence of keystrokes. Just remember to keep the following in mind:
 To perform a DO Command, press DO then the button you assigned to remember the DO Command. However, if you assigned the DO1 or DO2 buttons to remember a DO Command, you do not have to press DO first, just press DO1 or DO2.
 If the device 10 light (LED4) starts blinking green, yellow, red while you are trying to teach it, it is telling you that RAM 54 is full. The DO command you are teaching is automatically erased. You can teach the device 10 a shorter DO command, or erase some other DO command you have already taught the device 10 to obtain more memory space.
 After the DO Command is finished, the last apparatus 10 selected within the DO Command will be the apparatus the device 10 will work with next. Erasing a DO command If you just want to change a DO Command, you do not have to erase it first—just set up the new DO Command in its place. However, to get rid of a DO Command without replacing it with a new one:
 1. Press DO Recall.
 2. Press the button you have assigned to the DO command that you want to erase. For example, to erase the DO command you taught the device 10 in the above example: Press DO1.
 3. Press DO, Recall again. The old DO Command is now erased.
QUICK-MATCHING To Your Equipment
 There is a quicker way to match your equipment to the device 10 by Quick-Matching. Quick-Matching is a way to set the device 10 directly to match any controlled equipment in its library. Follow the steps below to do a Quick-Match:
 1. Match the device 10 to your equipment using STEP-and-SET.
 2. Press DO, then the desired device button (TV, VCR1, VCR2, Cable or CD). The device 10 light will blink red or green eight times.
 3. Write down the sequence of red and green blinks. This is the "Blink Code" for the particular device.
 4. Press DO Enter Recall. This tells the device 10 to do a Quick-Match.
 5. Enter the correct sequence by pressing Ch Dn for "R" and Ch Up for "G". The device 10 light (LED 4) will flash "red" or "green" depending on what button you push. The Ch Dn and Ch Up buttons 25 are labelled with the correct color for each.
 6. When the device 10 has successfully Quick-Matched your equipment it will automatically flash green twice. If it did not match, it will flash yellow. If it fails to Quick-Match, it is probably because the requisite code data is not stored in the library in your device 10.
QUICK-MATCHING Between Controlled Equipment
 One of the great benefits of Quick-Matching is that you can switch the device 10 functions between the remote controlled TVs, VCRs and cable converters you may own. This is done by using "Quick-Match" within a "DO command".
 Let's suppose you have two TVs in your house and only one device 10. Here's how to switch between them:
 1. Press DO Recall. the button you want to use to switch to your other TV set.
 For example, press DO2. This tells the device 10 that you want to teach it a DO Command.
 2. Press DO Enter Recall. This tells the device 10 that you want to do a Quick-Match.
 3. Enter the R and G blink sequence of the second TV you want to control by pressing Ch Dn for "R" and Ch Up for "G".
 4. Press DO, Recall. This tells the device 10 that you are finished teaching it a "DO command".
 Now, to set the device 10 to control your second TV, press DO2. This tells the device 10 that you will be controlling your second TV.
 To go back to controlling your first TV, simply teach device 10 another "DO command". Just repeat the steps above, except use a different button and the correct R and G sequence for your first TV.
 The device 10 can easily be taught to control a whole houseful of infrared remote controlled equipment—just teach the device 10 a DO Command to QUICK-MATCH each additional piece of equipment.
 In FIG. 20 is shown a unique signal coupling and converting assembly 206 which includes a connector assembly 207, a cable 208 and a special cover plate 210 for the battery compartment 45. The cover plate 210 has on the underside thereof three pins 212, 214 and 216 which are positioned to connect with the three serial ports 1, 2 and 3. The pins 212, 214 and 216 mounted to the cover plate 210 are connected by three wire conductors 224, 226 and 228 in cable 208 to connector assembly 207 which has conversion circuitry 230 therein. The connector assembly 207 has a nine pin array 250 of sockets 251–259 for receiving nine pins and the conversion circuitry 230 which enables one to use some of the nine sockets 250 of the connector assembly 207 for communication with the three pins 212, 214, 216 that are connected to the serial ports 1, 2 and 3 as shown in FIGS. 21 and 22.

FIGS. 21 and 22 are a schematic diagram of the conversion circuitry 230.

In FIG. 21 is shown circuit portion 230A. In this circuit portion, plus nine volts goes into pin 4 of connector DB-9 or pin 20 of connector DB-25 and minus 9 volts goes into pin 7 of DB-9 or pin 4 of connector DB-25, which are connected to the circuit portion 230A of the conversion circuitry 230. This provides a constant source of positive and negative voltage and is used as the power supply for the circuit. Note that two different types of personal computer host female connectors can be used, namely, female connector DB-9 or female connector DB-25 in the connector assembly 207.

Serial information is transmitted by the hand held control device 10 via line HTXD at serial port 1 and is level translated by the operating circuitry 42 from a range of from plus 5 volts to zero volts to a range of from minus 9 volts to plus 9 volts.

In this respect, when 0 volts is present at serial port 1, transistors Q1 and Q2 are turned on such that +9 volts is supplied from pin 4 of connector DB-9 or pin 20 of connector DB25 through transistor Q1 to pin 2 of connector DB-9 or pin 3 of connector DB-25.

Then, when +5 volts is present at serial port 1, the emitter-base of transistor Q2 is reverse biased, turning off transistor Q2 which turns off transistor Q1. As a result, the 9 volts at pin 7 of connector DB-9 or pin 4 of connector DB-25 is supplied through resistor 270 to pin 2 of connector DB-9 or pin 3 of connector DB-25.

The circuit portion 230B is shown in FIG. 22 and performs a receiving function for the control device 10. When pin 3 of connector DB-9 or pin 2 of connector DB-25 is at–9 volts, its normal resting state, then HTXD at serial port 3 is at 0 volts. When pin 3 of connector DB-9 or pin 2 of connector DB-25 goes to +9 volts, HTXD at serial port 3 goes to plus 5 volts. Pin 5 of connector DB-9 or pin 7 of connector DB-25 is directly connected to serial port 2 and always stays at ground.

In transmitting data to the control device 10, the programming computer supplies +9 v or –9 v to pin 3 of connector DB-9 or pin 2 of connector DB-25. When +9 v is present on IBMTXD, 4.3 volts established by Zener diode 272 is passed through diode 274 to serial port 3.

When –9 v is present on IBMTXD, the Zener diode 272 clamps to–0.6 volts resulting in conduction through transistor Q3 pulling serial port 3 to 0 volts.

The diode 274, the transistor Q3 and a resistor 276 connected as shown are provided to allow pressing a key 25 on keyboard 26 to "wake up" CPU 56 (actuate the wake up circuit 70) even though circuit portion 230B is connected to the control device 10.

From the foregoing description, it will be apparent that the universal remote control device 10, the signal coupling and converting assembly 206, the disclosed methods of learning and storing infrared codes, and the methods for operating the control device 10 of the present invention have a number of advantages, some of which have been described above and others of which are inherent in the device 10, assembly 206 and the methods of the invention disclosed herein. For example:

(1) With no ROM in the circuitry 42, the instruction codes and code data in the RAM 54 can be upgraded at any time via the serial ports 1, 2 and 3.

(2) By loading the instruction codes and initial code directly into the RAM 54 by tri-stating the CPU 56, the circuitry 42 is enabled to function without a ROM.

(3) The serial ports 1, 2 and 3 together with the signal coupling and converting assembly 206 enable new data to be input into the circuitry 42 from an RS-232 interface device to the serial ports 1, 2 and 3.

(4) The visible LED 4 providing red/green/yellow/off blink code provides a means for communicating to the user where the device 10 has "landed" after searching for codes to control a specific apparatus. The user can then look up in the instruction booklet what extended functions are available via the letter keys A–H or number keys, plus the DO key for that particular apparatus or equipment.

(5) The write-protect circuit 78 prevents corruption of the operating program or data in the RAM 54 during transient states when the microprocessor is being turned on or turned off.

(6) The multiplexing of the address and data lines between the RAM 54 and the CPU 56 enables scrambling of the instruction codes and the code data so that the memory image in the RAM 54 is encrypted.

(7) The construction of the keyboard 61 enables one to have 56 keys which can be decoded using only 8 bidirectional input (and output) ports 63.

(8) The keyboard 61 including the keyboard circuitry 62 plus the walk-up circuit 70 provides a system whereby pressing any key turns on power to the CPU 56.

(9) The provision of three infrared LEDs 1, 2 and 3 with no current-limiting resistors enables the device 10 to use maximum energy to create the infrared control pulses with a minimum amount of energy wasted.

(10) The DO keys together with the numeral and letter keys allow a number of DO functions to be performed with the device 10 by a user.

(11) Any combination of products can be controlled with the universal remote control device 10.

(12) The step-and-set method for locating the code data for generating the infrared code necessary to operate the user's equipment or for the user to learn that such code data is not present in the library in the RAM 54.

Also modifications can be made to the device 10, the assembly 206 and the described methods of the present invention without departing from the teachings of the present invention. Accordingly, the scope of the invention is only to be limited as necessitated by the accompanying claims.

What is claimed is:

1. A method of identifying code data stored in a hand held remote control, the method comprising:

storing code data for controlling a device in memory of the remote control;

associating the code data stored in memory with a light emitting diode (LED) visible emission pattern;

associating the code data stored in memory with a user input; and in response to a user entering the user input, emitting from an LED the LED visible emission pattern.

2. The method of claim 1, wherein the user input comprises activation of a key selecting one of a plurality of operating modes for the remote control.

3. A method of manufacturing a hand held remote control comprising:

storing in memory a plurality of code data for controlling a plurality of devices;

providing programming for converting the plurality of code data to a plurality of infrared codes; and providing an association between the plurality of code data and a plurality of light emitting diode (LED) visible emission patterns.

4. A hand held remote control comprising:

code data associated with a plurality of modes;

programming for converting code data to infrared codes used to command the operation of an electronic device;

a transmission circuit for transmitting infrared codes to the electronic device;

a plurality of light emitting diode (LED) visible emission patterns associated with the code data; and a LED which visibly emits one or more of the plurality of visible emission patterns dependent upon which infrared codes are being transmitted to the electronic device.

5. A hand held remote control comprising:

programming for selecting one of a plurality of device modes;

code data associated with a plurality of device modes;

a plurality of light emitting diode (LED) visible emission patterns associated with the device modes; and a LED adapted to emit the visible emission patterns, whereby information concerning the device modes may be communicated to a user.

6. A method of setting a device code in a remote control, the method comprising:

in response to a user device mode input, selecting a device mode corresponding to the user device mode input;

in response to a user setup device input, entering a setup mode;

receiving through key actuation inputs a code corresponding to a device to be controlled; and after receiving the code corresponding to the device to be controlled; emitting a light emitting diode (LED) visible pattern.

7. The method of claim 6, wherein the key actuation inputs for the code corresponding to the device to be controlled comprises a predetermined number of key actuation inputs.

8. The method of claim 7, testing if the predetermined number of key actuation inputs have been entered.

9. A remote control device code entry method comprising:

in response to input from a user, entering a setup mode corresponding to a device to be controlled;

receiving a device code input from the user;

testing if the device code input is in a library stored in memory of the remote control; and if the device code input is in the library, causing a light emitting diode (LED) to visibly flash twice.

10. A method of identifying code data in a remote control, the method comprising:

receiving in the remote control a predetermined key sequence comprising one of a plurality of device mode keys and at least one predetermined key; and causing a light emitting diode (LED) in the remote control to visibly blink a code corresponding to the code data, whereby the code data for controlling a device corresponding to the device mode key may be identified by a user.

11. The method of claim 10, comprising providing the user access to a table cross referencing the code blinked by the LED and the device corresponding to the device mode key.

12. In a remote control adaptable to control a plurality of different types of electronic devices of different makes and different models, a readable media having instructions for conveying setup information to a user, the instructions performing steps comprising:

accepting user input specifying a type of electronic device to be controlled by the remote control;

accepting user input requesting setup information; and in response to the request, blinking an LED on the remote control to provide a visual representation of a make of the specified type of electronic device which the remote control is presently adapted to control.

13. The readable media as recited in claim 12, wherein the instructions further perform the step of blinking the LED to provide a visual representation of a make and model of the specified type of electronic device which the remote control is presently adapted to control.

14. The readable media as recited in claim 12, wherein the visual representation is a color coded pattern.

* * * * *